(12) United States Patent
von Koblinski et al.

(10) Patent No.: US 8,865,522 B2
(45) Date of Patent: Oct. 21, 2014

(54) METHOD FOR MANUFACTURING SEMICONDUCTOR DEVICES HAVING A GLASS SUBSTRATE

(71) Applicant: Infineon Technologies Austria AG, Villach (AT)

(72) Inventors: Carsten von Koblinski, Bodensdorf (AT); Gerald Lackner, Arnoldstein (AT); Karin Schrettlinger, Trebesing (AT); Markus Ottowitz, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/865,579

(22) Filed: Apr. 18, 2013

(65) Prior Publication Data
US 2013/0228905 A1   Sep. 5, 2013

Related U.S. Application Data

(60) Continuation-in-part of application No. 13/495,603, filed on Jun. 13, 2012, now Pat. No. 8,546,934, which is a division of application No. 12/837,155, filed on Jul. 15, 2010, now Pat. No. 8,202,786.

(51) Int. Cl.
| | | |
|---|---|---|
| H01L 21/00 | (2006.01) | |
| H01L 21/30 | (2006.01) | |
| H01L 23/12 | (2006.01) | |
| H01L 23/06 | (2006.01) | |
| H01L 23/495 | (2006.01) | |
| H01L 21/56 | (2006.01) | |
| H01L 23/00 | (2006.01) | |
| H01L 23/31 | (2006.01) | |
| H01L 21/78 | (2006.01) | |
| H01L 29/78 | (2006.01) | |
| H01L 29/861 | (2006.01) | |

(52) U.S. Cl.
CPC .......... *H01L 24/83* (2013.01); *H01L 2924/1033* (2013.01); *H01L 2224/04042* (2013.01); *H01L 23/49534* (2013.01); *H01L 2224/03848* (2013.01); *H01L 2924/01068* (2013.01); *H01L 2224/4903* (2013.01); *H01L 21/56* (2013.01); *H01L 29/7802* (2013.01); *H01L 2224/73265* (2013.01); *H01L 2224/05166* (2013.01); *H01L 21/568* (2013.01); *H01L 2224/05124* (2013.01); *H01L 2924/10373* (2013.01); *H01L 2224/94* (2013.01); *H01L 2924/01078* (2013.01); *H01L 24/03* (2013.01); *H01L 29/8611* (2013.01); *H01L 21/561* (2013.01); *H01L 2224/05647*

(Continued)

(58) Field of Classification Search
None
See application file for complete search history.

(56) References Cited

U.S. PATENT DOCUMENTS

| | | | |
|---|---|---|---|
| 4,235,645 A | 11/1980 | Johnson | |
| 5,259,737 A | 11/1993 | Kamisuki et al. | |

(Continued)

FOREIGN PATENT DOCUMENTS

| | | | | |
|---|---|---|---|---|
| JP | 10-098121 | * | 4/1998 | .............. H01L 23/02 |
| JP | 2007-158212 | * | 6/2007 | ............ H01L 21/301 |

OTHER PUBLICATIONS

Office Action mailed Sep. 6, 2012 in U.S. Appl. No. 12/837,189.

(Continued)

*Primary Examiner* — Scott B Geyer
(74) *Attorney, Agent, or Firm* — Dicke, Billig & Czaja, PLLC

(57) ABSTRACT

A method for connecting a semiconductor chip to a metal layer of a carrier substrate is disclosed. A semiconductor chip is provided which has a first side, a second side opposite the first side, a glass substrate bonded to the second side of the semiconductor chip and including at least one opening leaving an area of the second side of the semiconductor chip uncovered by the glass substrate, and a metallization region arranged in the opening of the glass substrate and electrically contacting the second side of the semiconductor chip. The semiconductor chip with the bonded glass substrate is brought onto a metal layer of a carrier substrate. A firm mechanical and electrical connection is formed between the metal layer of the carrier substrate and the metallization region.

23 Claims, 12 Drawing Sheets

(52) U.S. Cl.
(2013.01); *H01L 2924/10253* (2013.01); *H01L 2224/48227* (2013.01); *H01L 2924/1306* (2013.01); *H01L 2224/32225* (2013.01); *H01L 2924/01327* (2013.01); *H01L 2224/05139* (2013.01); *H01L 2224/32245* (2013.01); *H01L 2224/03462* (2013.01); *H01L 2224/05571* (2013.01); H01L 23/3107 (2013.01); *H01L 2224/0346* (2013.01); *H01L 2224/03015* (2013.01); *H01L 2924/10351* (2013.01); *H01L 2224/03464* (2013.01); *H01L 2224/4823* (2013.01); *H01L 24/48* (2013.01); *H01L 2224/06181* (2013.01); *H01L 2924/3511* (2013.01); *H01L 24/73* (2013.01); *H01L 2224/0603* (2013.01); *H01L 2924/01322* (2013.01); *H01L 2924/10331* (2013.01); *H01L 2224/03019* (2013.01); *H01L 2224/0345* (2013.01); *H01L 2924/10335* (2013.01); *H01L 2224/83192* (2013.01); *H01L 2224/48247* (2013.01); *H01L 24/32* (2013.01); *H01L 2924/10329* (2013.01); *H01L 2224/48463* (2013.01); H01L 21/78 (2013.01); H01L 24/06 (2013.01); *H01L 2924/10272* (2013.01); *H01L 2924/10338* (2013.01); *H01L 23/3135* (2013.01); *H01L 2924/10271* (2013.01); *H01L 2224/3223* (2013.01); *H01L 2224/0332* (2013.01); *H01L 2924/13055* (2013.01); H01L 24/05 (2013.01); *H01L 2924/13062* (2013.01); *H01L 2224/02122* (2013.01)
USPC .......... 438/110; 438/118; 438/125; 438/455; 438/458; 257/701; 257/704; 257/729

(56) References Cited

U.S. PATENT DOCUMENTS

| | | | |
|---|---|---|---|
| 5,798,557 A | 8/1998 | Salatino et al. | |
| 5,825,092 A | 10/1998 | Delgado et al. | |
| 6,146,917 A | 11/2000 | Zhang et al. | |
| 6,391,742 B2 | 5/2002 | Kawai | |
| 6,630,725 B1 | 10/2003 | Kuo et al. | |
| 6,835,588 B2 | 12/2004 | An et al. | |
| 6,841,839 B2 | 1/2005 | Sridhar et al. | |
| 7,098,117 B2 | 8/2006 | Najafi et al. | |
| 7,138,335 B2 | 11/2006 | Toyoda et al. | |
| 7,204,737 B2 | 4/2007 | Ding et al. | |
| 7,208,337 B2 | 4/2007 | Eisert et al. | |
| 7,393,758 B2 | 7/2008 | Sridhar et al. | |
| 7,408,257 B2 | 8/2008 | Jung et al. | |
| 7,419,840 B2 | 9/2008 | Omori | |
| 7,605,057 B2 | 10/2009 | Shimoyama et al. | |
| 7,622,324 B2 | 11/2009 | Enquist et al. | |
| 7,867,807 B2 | 1/2011 | Kishita et al. | |
| 8,012,850 B2 | 9/2011 | Kojima et al. | |
| 8,546,934 B2 | 10/2013 | Von Koblinski et al. | |
| 2002/0019079 A1 | 2/2002 | Kawai | |
| 2005/0009315 A1 | 1/2005 | Kim et al. | |
| 2006/0160273 A1 | 7/2006 | Chen | |
| 2008/0003720 A1 | 1/2008 | Lu et al. | |
| 2008/0032488 A1 | 2/2008 | Chu et al. | |
| 2008/0217743 A1 | 9/2008 | Kojima et al. | |
| 2009/0181520 A1 | 7/2009 | Li et al. | |
| 2010/0117176 A1 | 5/2010 | Uekawa | |
| 2010/0201221 A1 | 8/2010 | Inoue et al. | |
| 2010/0207697 A1 | 8/2010 | Sayama | |
| 2011/0018112 A1 | 1/2011 | Ogura et al. | |

OTHER PUBLICATIONS

Final Office Action mailed Mar. 13, 2013 in U.S. Appl. No. 12/837,189.

Office Action mailed Sep. 16, 2013 in U.S. Appl. No. 13/966,492.

Final Office Action mailed Jan. 28, 2014 in U.S. Appl. No. 13/966,492.

Notice of Allowance mailed Feb. 22, 2012 in U.S. Appl. No. 12/837,155.

Notice of Allowance mailed May 28, 2013 in U.S. Appl. No. 13/495,603.

* cited by examiner

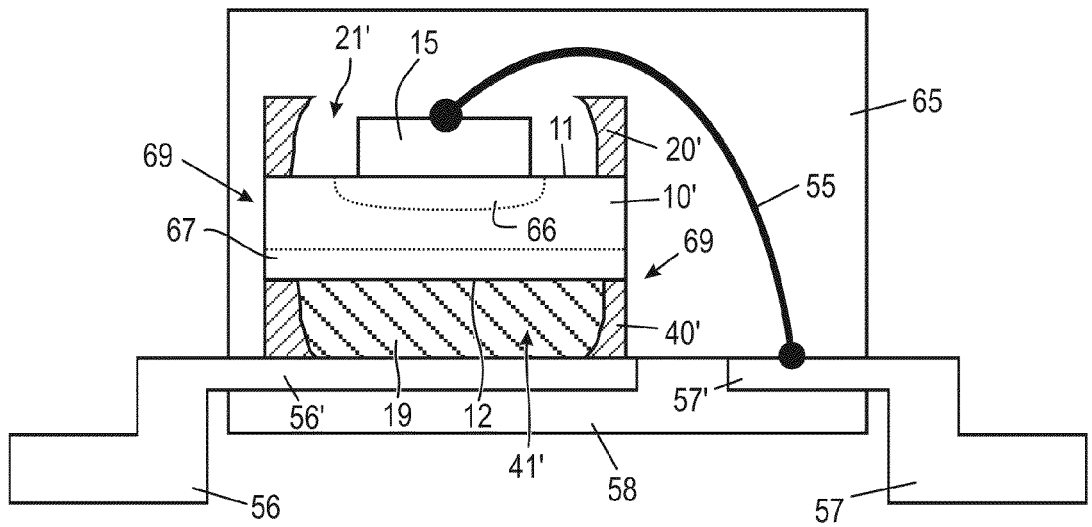
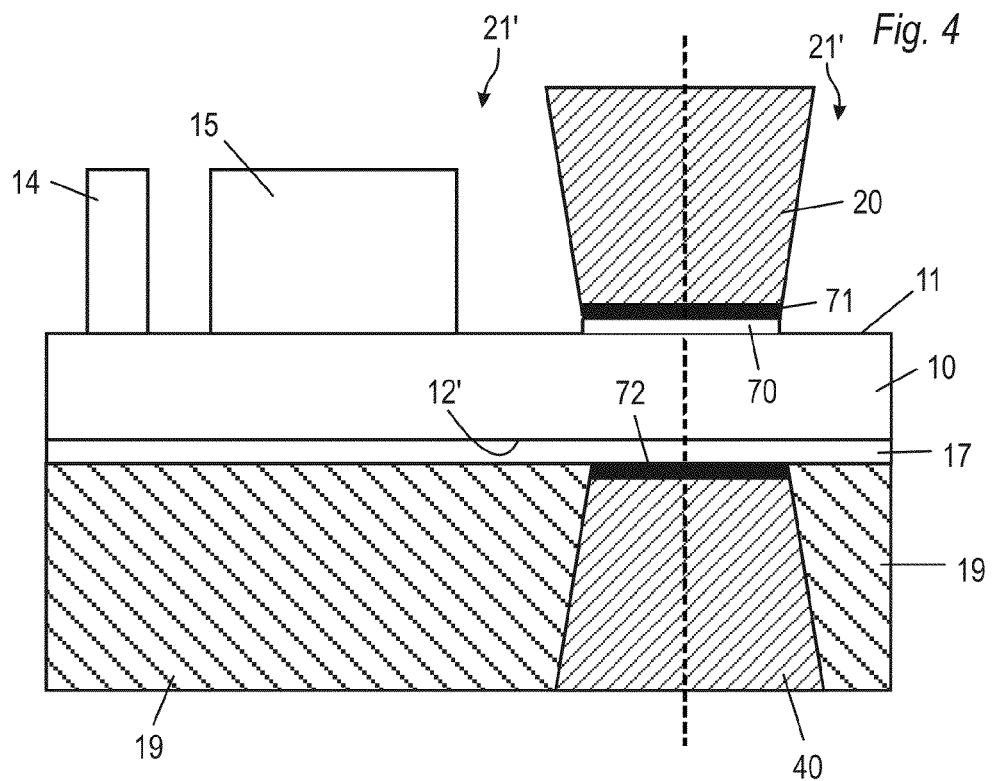

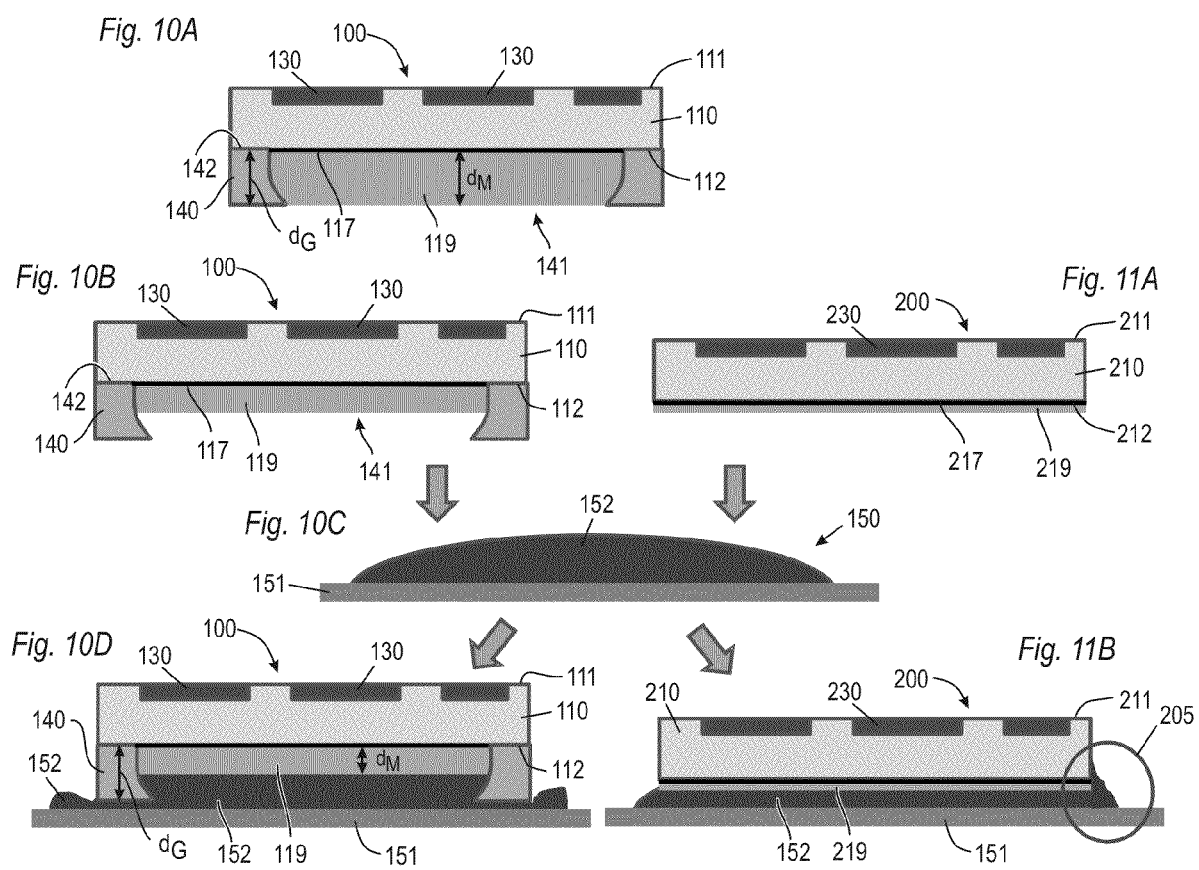

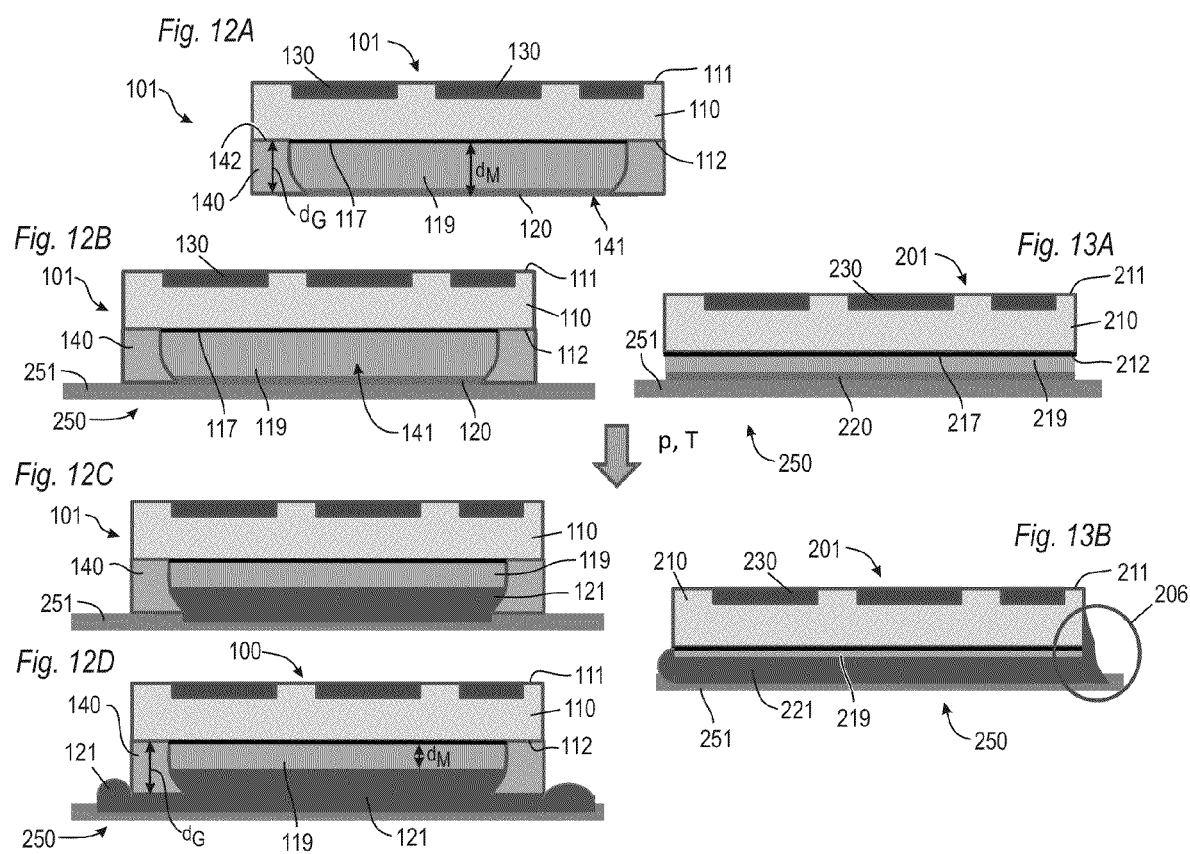

METHOD FOR MANUFACTURING SEMICONDUCTOR DEVICES HAVING A GLASS SUBSTRATE

CROSS-REFERENCE TO RELATED APPLICATIONS

This Utility Patent application is a continuation-in-part application of U.S. application Ser. No. 13/495,603 filed Jun. 13, 2012, which is a divisional of U.S. application Ser. No. 12/837,155, filed Jul. 15, 2010, now U.S. Pat. No. 8,202,786, issued Jun. 19, 2012, both of which are incorporated herein by reference.

BACKGROUND

This description refers to embodiments of semiconductor devices having a glass substrate. Hereinafter are also described embodiments of methods for manufacturing semiconductor devices having a glass substrate. One or more embodiments relate to power semiconductor devices.

In order to improve the device characteristics of semiconductor devices attempts have been made to reduce the final thickness of semiconductor material, particularly for power semiconductor devices. It is desired that the semiconductor chip of such devices has a thickness which is just sufficient for accommodating the device or circuit.

The manufacturing and handling of thin semiconductor chips and wafers is complicated since the brittle semiconductor material, once thinned, is prone to breaking. To improve the mechanical stability of thinned semiconductor material, carrier systems have been developed which can be classified as reversible and irreversible carrier systems.

Irreversible carrier systems include a carrier which is irreversibly attached to the semiconductor material. Reversible carrier systems include a carrier which is reversibly connected to the semiconductor material, i.e. the chip can be detached from the carrier without being damaged so that the carrier will not be a part of the finished semiconductor device. Irrespectively which carrier system is used, it will be subjected to, at least to some extent, various processes together with the semiconductor material. Some of the processes are carried out at high temperatures. The bond connection between the carrier and the semiconductor material must withstand such high temperatures.

Reversible carrier systems typically include bond connections which can tolerate only moderate temperatures, for example up to 250° C. for a short time. Irreversible carrier systems can withstand higher temperatures.

Commonly known carrier systems, however, merely mechanically support the fragile semiconductor material and facilitate the handling. Furthermore, when forming thick metallisation regions on thin semiconductor substrates, the substrates may be deformed by the thick metallisation.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates a semiconductor device such as a power semiconductor device according to one embodiment.

FIG. 4 illustrates an enlarged view of a detail of FIG. 2F.

FIGS. 10A to 10D illustrate processes of a method for connecting a semiconductor chip to a metal layer of a carrier substrate according to one embodiment.

FIGS. 11A to 11B illustrate a comparison example of processes for connecting a semiconductor chip to a metal layer of a carrier substrate.

FIGS. 12A to 12D illustrate processes of a method for connecting a semiconductor chip to a metal layer of a carrier substrate according to one embodiment.

FIGS. 13A to 13B illustrate a comparison example of processes for connecting a semiconductor chip to a metal layer of a carrier substrate.

DETAILED DESCRIPTION

Figure 1A:
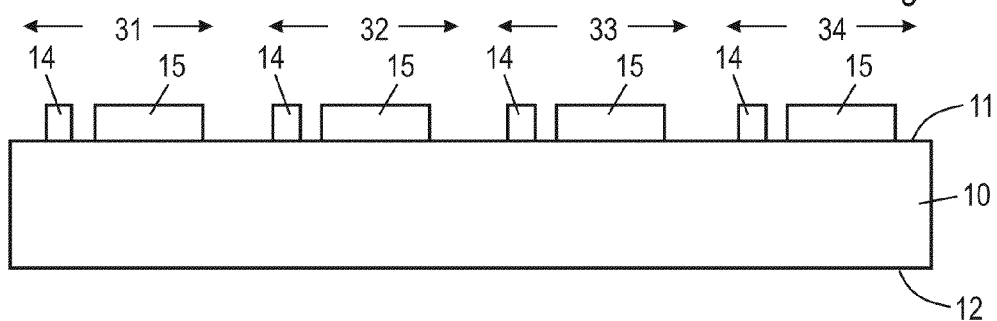
FIGS. 1A to 1E illustrate processes of a method for manufacturing semiconductor devices according to one embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The term "semiconductor component" as used in this specification intends to describe a semiconductor device which is at least partially processed in and on the semiconductor wafer. Partially processed means that the semiconductor device is not fully completed and that further processes such as formation of doping regions, contact regions and metallisation, and dicing are needed to obtain an operable semiconductor device.

The semiconductor device is at least a two-terminal device, an example is a diode. The semiconductor device can also be a three-terminal device such as a field-effect transistor (FET), insulated gate bipolar transistor (IGBT), junction field effect transistors (JFET), and thyristors to name few. The semiconductor device can also include more than three terminals.

Specific embodiments described herein pertain to, without being limited thereto, power semiconductor devices and particularly to devices which are controlled by field-effect.

According to one or more embodiments, a method for connecting a semiconductor chip to a metal layer of a carrier substrate includes providing a semiconductor chip having a first side, a second side opposite the first side, a glass substrate bonded to the second side of the semiconductor chip and including at least one opening leaving an area of the second side of the semiconductor chip uncovered by the glass substrate, and a metallisation region arranged in the opening of the glass substrate and electrically contacting the second side of the semiconductor chip; providing a carrier substrate having a metal layer; bringing an electrically conductive bonding material on at least one of the metal layer of the carrier substrate and the metallisation region in the opening of the glass substrate; placing the semiconductor chip with the bonded glass substrate onto the metal layer of the carrier substrate with the electrically conductive bonding material arranged between the metallisation region and the metal layer; and forming a firm mechanical and electrical connection between the metal layer and the metallisation region through the electrically conductive bonding material.

According to one or more embodiments, a method for connecting a semiconductor chip to a metal layer of a carrier substrate includes providing a semiconductor chip having a first side, a second side opposite the first side, a glass substrate bonded to the second side of the semiconductor chip and including at least one opening leaving an area of the second side of the semiconductor chip uncovered by the glass substrate, and a metallisation region arranged in the opening of the glass substrate and electrically contacting the second side of the semiconductor chip, the metallisation region being covered by a reactive metal layer; pressing the semiconductor chip with the bonded glass substrate onto a region of a metal layer of a carrier substrate so that the reactive metal layer comes into contact with the metal layer; and heating the semiconductor chip pressed on the metal layer.

According to one or more embodiments, a method for connecting a semiconductor chip to a metal layer of a carrier substrate includes providing a semiconductor chip having a first side, a second side opposite the first side, a glass substrate bonded to the second side of the semiconductor chip and including at least one opening leaving an area of the second side of the semiconductor chip uncovered by the glass substrate, and a metallisation region arranged in the opening of the glass substrate and electrically contacting the second side of the semiconductor chip; bringing the semiconductor chip with the bonded glass substrate onto a metal layer of a carrier substrate; and forming a firm mechanical and electrical connection between the metal layer of the carrier substrate and the metallisation region.

According to one or more embodiments, a semiconductor device includes a semiconductor chip having a first side and a second side opposite the first side; a glass substrate bonded to the second side of the semiconductor chip and including at least one opening leaving an area of the second side of the semiconductor chip uncovered by the glass substrate; a metallisation region arranged in the opening of the glass substrate and electrically contacting the second side of the semiconductor chip; a carrier substrate having a metal layer; and a firm mechanical and electrical connection between the metal layer of the carrier substrate and the metallisation region.

According to one or more embodiments, a method for manufacturing semiconductor devices is provided. A semiconductor wafer is provided having a first surface and a second surface opposite to the first surface, wherein the semiconductor wafer includes a plurality of doping regions and metal pads, which are arranged on or at the first surface. A first glass substrate is provided which has a bonding surface and at least one of cavities and openings at the bonding surface. The first glass substrate is bonded with its bonding surface to the first surface of the semiconductor wafer such that the metal pads are arranged within respective cavities or openings of the first glass substrate. The second surface of the semiconductor wafer is machined to reduce the thickness of the semiconductor wafer. At least one metallisation region is formed on the machined second surface of the semiconductor wafer, and the semiconductor wafer and the first glass substrate are diced to obtain separate semiconductor devices.

According to one or more embodiments, a method for manufacturing semiconductor devices is provided. A semiconductor wafer and a glass substrate are provided. Trenches are formed in the glass substrate along pre-defined break lines. The glass substrate is bonded to the semiconductor wafer, and the semiconductor wafer and glass substrate are diced by breaking along the trenches.

With reference to FIGS. 1A to 1E, a first embodiment of a method for manufacturing semiconductor devices is described. A semiconductor wafer 10 is provided which includes a first surface 11 and a second surface 12 arranged opposite to the first surface 11. The semiconductor wafer 10 includes a plurality of doping regions which are not illustrated in FIG. 1A. FIGS. 2H and 3, which illustrate enlarged details of finished semiconductor devices, includes doping regions. The doping regions are for example formed at the first surface 11 and form, for example, anode regions of diodes. In case of a FET, the doping regions can be body regions and/or source regions.

The semiconductor substrate 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Metal pads 14, 15 are arranged on the first surface 11. Metal pad 14 can be, for example, a gate pad structure while metal pad 15 can be, for example, a source pad structure.

The semiconductor wafer 10 includes a plurality of commonly processed semiconductor components, i.e. not yet finished semiconductor devices. FIG. 1A exemplifies this by indicating several semiconductor components 31, 32, 33 and 34 formed in the semiconductor wafer 10. In this embodiment, each semiconductor component 31, 32, 33 and 34 includes one metal pad 14 and one metal pad 15. The metal pads 14, 15 can be comprised of the same metal or of different metals. Furthermore, the metal pads 14, 15 can be of different height and structure. For example, a metal pad used as source metallisation will typically be larger than a metal pad used as gate metallisation.

According to one or more embodiments, the processes for forming structures of the semiconductor components 31, 32, 33 and 34 at the first surface 11 are finished. This typically includes the formation of the metal pads 14, 15 which are later used as landing pads for bond wire connections.

According to one or more embodiments, the semiconductor components 31, 32, 33 and 34 can also be semi-finished. Typically, most of the structures including doping regions located at or near the first surface 11 have already been formed.

Figure 1B:
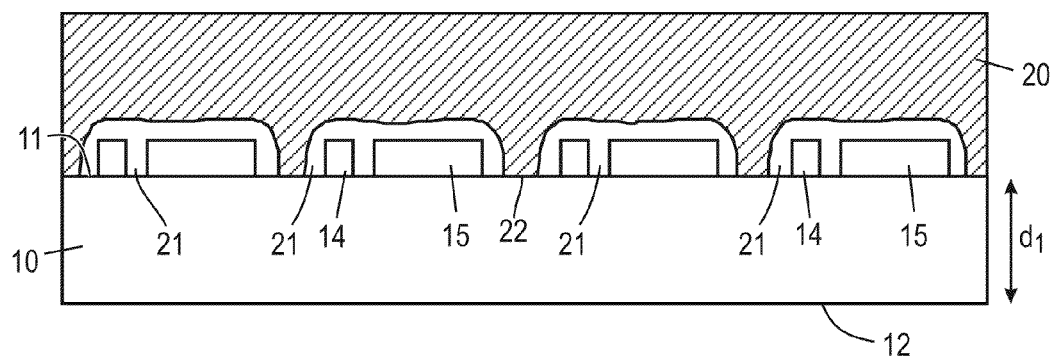

As illustrated in FIG. 1B, a first glass substrate 20 is provided which has a bonding surface 22. The first glass substrate 20 includes at least one of cavities and openings at the bonding surface. In the present embodiment, the first glass substrate 20 includes a plurality of cavities 21 formed at the bonding surface 22. In other embodiments, see for example FIGS. 5A to 5D, the glass substrate includes openings.

In this specification, cavities are only open to the bonding surface of the glass substrates while openings are open to the bonding surface of the glass substrates and to the surface opposite to the bonding surface. Hence, cavities are single-sided open while openings are double-sided open.

The size of cavities 21 is adapted to accommodate the metal pads 14, 15 of the respective semiconductor component 31, 32, 33 and 34. In this embodiment, each cavity 21 is sized to accommodate both metal pads 14, 15. In other embodiments, see for example FIGS. 6A and 6D, the cavities are sized to accommodate only one of the metal pads.

The first glass substrate 20 is bonded with its bonding surface 22 to the first surface 11 of the semiconductor wafer 20 such that the metal pads 14, 15 are arranged within respective cavities 21 of the first glass substrate 20.

Figure 1C:
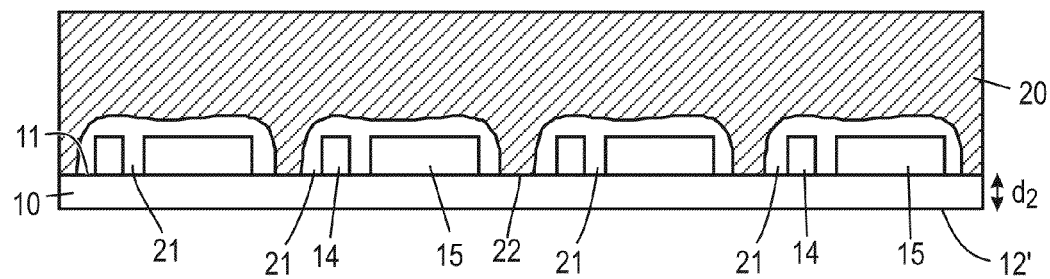

In a further process, as illustrated in FIG. 1C, the second surface 12 of the semiconductor wafer 10 is machined to reduce the thickness of the semiconductor wafer 10. Machining can include any suitable process to reduce the thickness of the semiconductor wafer 10. Examples are mechanical grinding, chemical-mechanical polishing, lapping and etching. Machining the second surface 12 of the semiconductor wafer 10 reduces the initial thickness $d_1$ of the semiconductor wafer 10 to a target thickness $d_2$ which is less than the initial thickness. Target thickness $d_2$ can be in a range from about 20 µm to about 100 µm. In one or more embodiments, target thickness $d_2$ can be from about 20 µm to about 50 µm.

Machining the second surface 12 of the semiconductor wafer 10 produces a machined second surface 12' as illustrated in FIG. 1C.

Figure 1D:
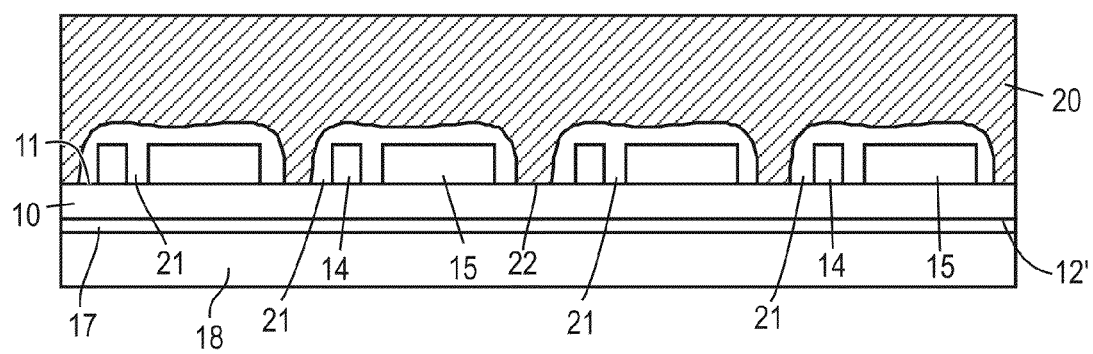

In a further process, which is illustrated in FIG. 1D, at least one metallisation region 17, 18 is formed on the machined second surface 12' of the semiconductor wafer 10. The formation of the metallisation region can include the formation of a thin metallic seed layer 17 and the subsequent formation of a thick metallic layer 18. Metallic seed layer 17 can be about 0.1 µm to about 2 µm thick while the metallic layer 18 can have a thickness of up to 100 µm. Metallic seed layer 17 can be formed by any suitable process such as metal sputtering or evaporation. Suitable materials for the metal seed layer 17 are silver (Ag), titanium (Ti) or aluminium (Al) to name a few.

The metallisation 18 can be formed, for example, by plating or printing. The seed layer 17 enables the metal plating on the machined second surface 12'. Virtually any type of metallisation can be formed on the machined second surface 12'.

Figure 1E:
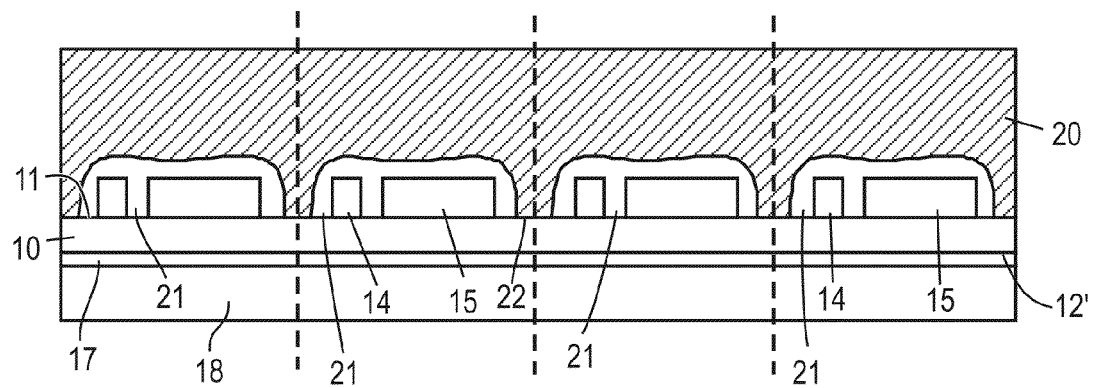

In a further process, as illustrated in FIG. 1E, the semiconductor wafer 10 is diced together with the first glass substrate 20 to obtain separate semiconductor devices. The separation lines along which the semiconductor wafer 10 and the glass substrate 20 are diced are illustrated in FIG. 1E by vertical dashed lines.

In connection with FIGS. 2A to 2H a more detailed process sequence according to one or more embodiments will be described below.

Figure 2A:
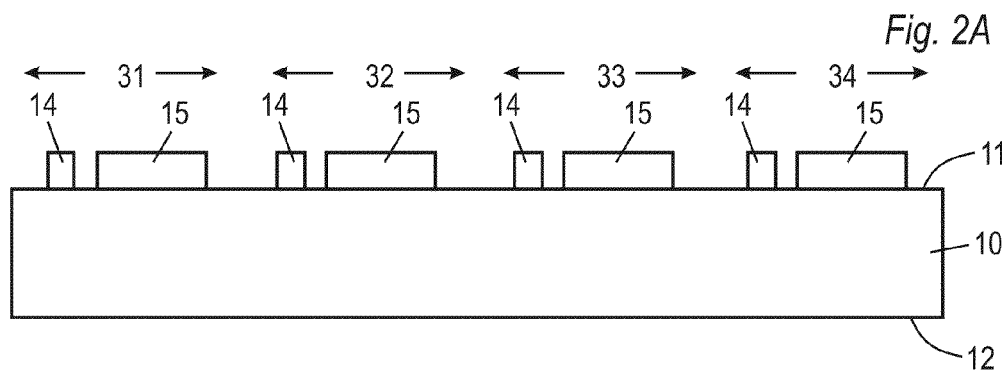
FIGS. 2A to 2H illustrate processes of a method for manufacturing semiconductor devices according to one embodiment.

Similar to the above described embodiment, a semiconductor wafer 10 having a first surface 11 and a second surface 12 is provided, as illustrated in FIG. 2A. Furthermore, a plurality of partially finished semiconductor devices, i.e., semiconductor components 31, 32, 33, 34 is formed in and on the semiconductor wafer 10, particularly at the first surface 11. Each of the semiconductor components 31, 32, 33, 34 includes at least one doping region and at least one metal pad 14, 15 arranged on the first surface 11 and in electrical contact with the doping region. Typically, the semiconductor components 31, 32, 33, 34 are of the same type. For example, all semiconductor components 31, 32, 33, 34 are power FETs, i.e. three-terminal devices.

In a further process, a pre-structured first glass substrate 20 is bonded with its bonding surface 22 to the first surface 11 of the semiconductor wafer 10. The first glass substrate 20 can be comprised of any suitable glass material such as pure quartz or any type of commercially available float glasses.

Cavities 21 are formed on the bonding surface 22 of the first glass substrate 20. The cavities 21 have respective sizes, i.e., depth and width, which are large enough to accommodate the structures of the semiconductor components 31, 32, 33, 34 formed on the first surface 11 of the semiconductor wafer 10.

The cavities 21 can be formed in advance by etching, for example. To this end, a mask defining the size and location of the cavities can be formed on the bonding surface 22. Any suitable etching process can be used, for example wet-chemical etching processes based on hydrofluoric acid (HF).

For bonding the first glass substrate 20 to the semiconductor wafer 10, any suitable bonding process can be employed.

For example, anodic bonding can be used to bond the first glass substrate 20 directly on the semiconductor wafer 10.

When the first surface 21 of the semiconductor wafer 20 is covered, for example by a thin insulating layer, other bonding processes are more suitable. For example, glass-frit bonding provides reliable bond connections. Glass frit bonding uses a glass solder which has a melting temperature lower than that of the first glass substrate 20. The fusible glass solder is melted and provides an adhesive bond which can withstand temperatures of up to 500° C. A suitable glass solder is lead glass with a sufficiently high content of lead oxide to reduce the viscosity and melting temperature of the glass. The glass solder can be, for example, deposited as a thin glass layer on either the first glass substrate 20 or the semiconductor wafer 10 and pre-glazed. The semiconductor wafer 10 and the first glass substrate 20 are then brought into contact at the designed melting temperature of the glass solder. Pressure is also applied to keep the semiconductor wafer 10 and the first glass substrate 20 in intimate contact.

Another option is fusion bonding. Fusion bonding is performed by joining the semiconductor wafer 10 and the first glass substrate 20 together. To this end, the first surface 11 of the semiconductor wafer 10 and the bonding surface 22 of the first glass substrate 20 are made either hydrophobic or hydrophilic and then brought into contact and annealed at high temperatures.

Anodic bonding, glass-fit bonding and fusion bonding produces bond connections which can withstand very high temperatures of more than 500° C. Anodic bonding and fusion bonding usually produces bond connections which can tolerate even higher temperatures.

Adhesive bonding using a glass adhesive can also be applied. For example, silicate adhesives can be used which are commercially available, for example, from Dow Corning. Depending on the nature of the glass adhesive, the adhesive bond connection can withstand temperatures of up to 250° C. to 300° C. for a short time in an inert atmosphere. This is sufficient for many of the manufacturing processes to which the semiconductor wafer is subjected for finishing the semiconductor components.

The glass adhesives, and also the glass solder, can also be photo-structurable when structuring is desired.

Further options include formation of a diamond-like-carbon layer (DLC) on the semiconductor wafer 10 to facilitate anodic bonding.

Figure 2B:
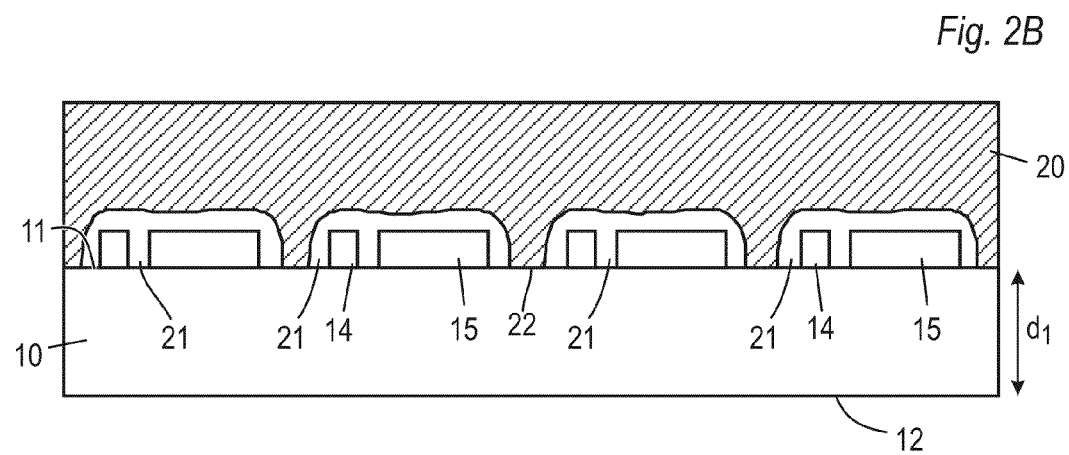

The resulting structure after bonding is illustrated in FIG. 2B.

After bonding the first glass substrate 20, the semiconductor wafer 10 is thinned to the target thickness $d_2$. The thinning process can include, without being limited thereto, grinding, etching and polishing of the second surface 12 to obtain a machined second surface 12'.

The structures of the semiconductor components 31, 32, 33, 34 on and at the first surface 11 are protected by the glass substrate 20 during thinning of the semiconductor wafer 20 since the cavities do no extend completely through the glass substrate 20. The structures of the semiconductor components 31, 32, 33, 34 are therefore sealed by the pre-structured glass substrate 20 during this processing.

In a further process, a thin metallic seed layer 17 is formed on the second surface 22 of the semiconductor wafer 20. The metallic seed layer 17 can be formed on the entire second surface 12. The metallic seed layer 17 is used for plating the metallisation in a later process. When other processes are used to form the metallisation, the metallic seed layer can be omitted. Furthermore, the seed layer 17 can also be formed, if needed, at a later stage. The thickness of the metallic seed layer 17 can be selected according to specific needs. It is also possible to provide the metallic seed layer 17 with a varying thickness. The material of the metallic seed layer 17 can be, for example silver (Ag), titanium (Ti) or aluminium (Al).

A pre-structured second glass substrate 40 having a plurality of cavities 41 formed at a bonding surface 42 is provided. The cavities 41 are sized to be smaller than the size of the final semiconductor device. The embodiment of FIGS. 2A to 2H illustrates cavities 41 which have a size similar to that of the cavities 21 of the first glass substrate 20.

Figure 2C:
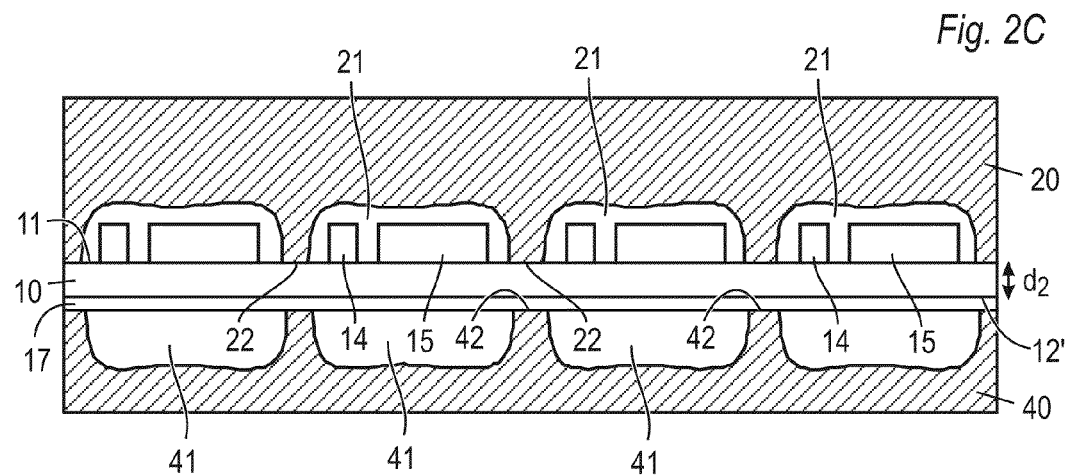

The second glass substrate 40 is bonded, with its bonding surface 42, to the semiconductor substrate 10 at its second surface 12'. When the second surface 12' of the semiconductor substrate 10 is covered by the thin metallic seed layer 17, the second glass substrate 40 is bonded using glass-frit bonding or adhesive bonding as described above. When no metallic seed layer 17 is used, any type of the above described bonding processes can be used. The resulting structure is illustrated in FIG. 2C.

To obtain sufficient bond strength, the contact area between the respective glass substrates 20, 40 and the semiconductor wafer 10 should be large enough. Since the respective bonding surfaces 22, 42 of the glass substrates 20, 40 are structured, the contact area is also structured. For many applications, it is sufficient when the wall thickness between adjacent cavities is about 50 μm or more to provide contact region having a size of 50 μm and more.

The first and second glass substrate 20, 40 are aligned with the semiconductor wafer 10 before bonding so that the respective cavities 21, 41 are aligned with the respective semiconductor components 31, 32, 33, 34. Alignment structures arranged in peripheral areas of the respective glass substrates 20, 40 and the semiconductor wafer 10 facilitates the alignment.

Figure 2D:
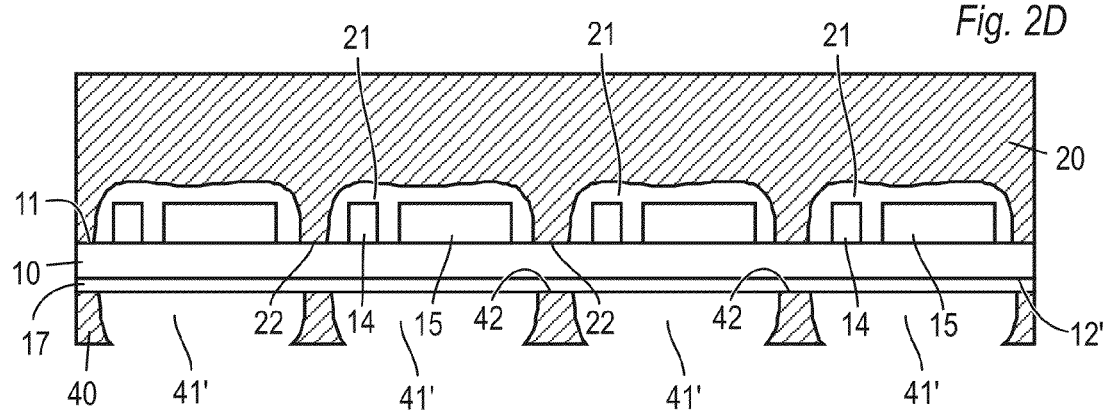

FIG. 2D illustrates a further process. The second glass substrate 40 is machined at its surface opposite to the bonding surface 42 to expose the cavities 41. Typically, the thickness of the second glass substrate 40 is reduced until the cavities 41 are exposed which than form openings 41' in the second glass substrate 40. The final thickness of the second glass substrate 40 can be selected according to specific needs. The machined second glass substrate 40 shall be thick enough to provide a sufficient mechanical stabilisation for the thin semiconductor wafer 10. The second glass substrate 10 can be grinded or polished or first grinded and then polished.

Figure 2E:
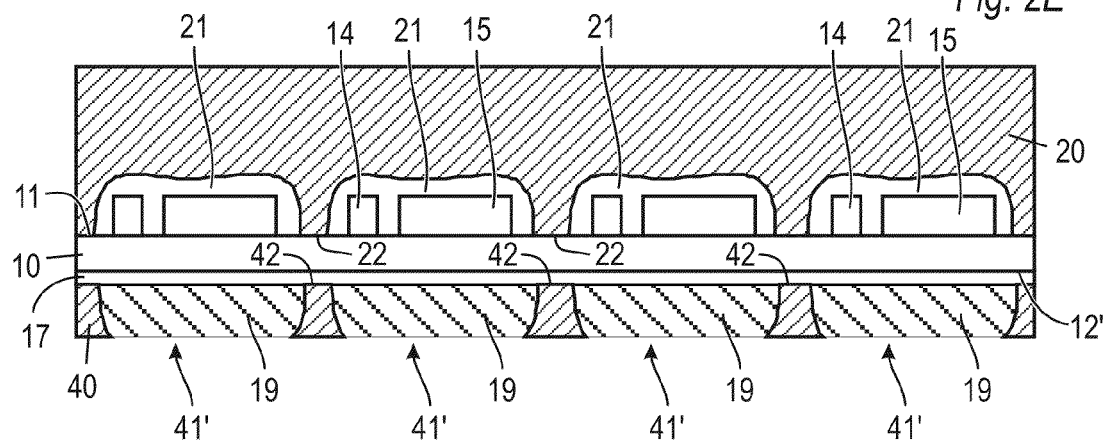

FIG. 2E illustrates processes for manufacturing metallisation regions on the second surface 22 of the semiconductor wafer 10. The machined second glass substrate 40 is used as a mask with the exposed cavities or openings 41' defining the size and location of the metallisation regions. In embodiments, each semiconductor component 31, 32, 33, 34 can be provided with one large metallisation region 19 which completely fills the opening 41'. By using the second glass substrate 40 as mask, a structured metallisation is formed with metallisation region 19 which are separated from each other.

Metallisation regions 19 can be formed, for example, by plating, printing or pasting. Typically, the exposed cavities or openings 41' are filled by a metal, metal compound or metal alloy. The metallic seed layer 17 formed on the entire second surface 12' of the semiconductor wafer facilitates plating which can be electroplating or electroless plating. Typically, copper is plated in a sufficient thickness to provide a good electrical connection and also a means for dissipating heat during operation of the semiconductor devices. Another option is printing or plating where a conductive past is brought onto the second glass substrate 20 and evenly distributed by a squeegee or doctor knife. The paste is then annealed to form conductive metallisation regions. The annealing temperature should be less than the temperature which the respective bond connection between the first and second glass substrates 20, 40 and the semiconductor wafer 10 can tolerate. Printing and pasting are cost efficient processes. Copper or a copper compound is typically used for printing or pasting due to the good electrical and thermal properties of copper.

In a further process, the first glass substrate 20 is machined to expose the cavities 21 and the metal pads 14, 15 arranged within the cavities 21. The resulting structure, illustrated in FIG. 2F, includes a first glass substrate 20 with a thickness less than the depth of the cavities 21 so that openings 21' are formed which laterally surrounds the metal pads 14, 15.

In one or more embodiments, the first and/or the second glass substrate 20, 40 provides a mechanical support for the semiconductor wafer 10 and form an irreversible carrier system. The glass substrate or glass substrates remain attached to the semiconductor wafer 10 and form an integral part of the final semiconductor devices. The final thickness of the glass substrate or glass substrates is not restricted to particular values and can be varied according to specific needs. The irreversible carrier system as described herein also allows handling of very thin semiconductor wafers 10. When the first and the second glass substrates 20, 40 are used, each glass substrate can be made comparably thin. Providing glass substrates on both sides of the semiconductor wafer also improves mechanical properties since a symmetrical support is formed.

Furthermore, the glass substrate or glass substrates can serve as device passivation. This allows omitting the commonly used polyimide-passivation. The glass passivation improves the electrical insulation due to the better dielectric characteristics of glass over polyimide.

The second glass substrate 40 provides a mask which allows structuring of the metallisation without the need of a further mask. This also facilitates the subsequent device separation as will be described below.

Figure 2F:
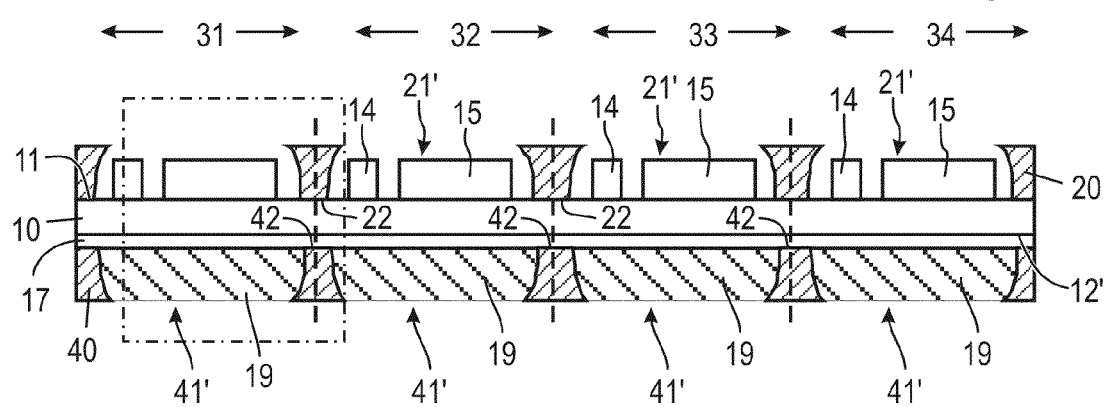

When separating the electronic components 31, 32, 33, 34 along separation lines indicated in FIG. 2F by dashed lines, the separation occurs through material having similar mechanical properties. FIG. 2F illustrates that the separation lines runs though the walls of the first and second glass substrates 20, 40 and also through the semiconductor wafer 10. The separation lines do not run through the thick portions of the metallisation, i.e. the metallisation regions 19 in this embodiment, and only through the optional thin metallic seed layer 17. The glass substrates 20, 40 and the semiconductor wafer 10 have similar mechanical properties as both materials are brittle. Different thereto, the thick metallisation is comprised of a ductile metal having mechanical properties different to that of the semiconductor wafer 10 and the glass substrates 20, 40. This difference in mechanical properties can cause difficulties during dicing, which difficulties can be reduced or avoided by the approach as described herein.

According to one or more embodiments, the back metallisation formed on the second surface 12' of the semiconductor wafer 10 is structured to have separate thick metal regions which are laterally spaced apart from each other. The space between the separate metallisation regions is used for dicing; hence the separation lines run along the spaces but not through the metallisation regions. This allows an even further increase of the thickness of the metallisation regions to improve thermal dissipation. The metallisation regions can have a thickness similar to the thickness of the glass substrate. For example, it is possible to provide up 100 μm thick or even thicker metallisation regions. The structuring of the metallisation on the second surface 12 of the semiconductor wafer 10 also reduces warping of the semiconductor wafer 10. As the separation does not go through the thick metallisation, the separation tools such as a saw are also not loaded with metal during separation which improves the separation process.

Dicing through the glass substrates 20, 40 and the semiconductor wafer 10 without dicing through the thick metallisation even allows separation by breaking. For dicing, any suitable dicing process can be used such as scribe-and-break, laser cutting and sawing. The optional thin metallic seed layer 17 does not significantly interfere with the above described dicing processes. When dicing the structure illustrated in FIG. 2F, separate semiconductor devices are formed each having a semiconductor chip 10', a first glass chip 20' and a second glass chip 40', respectively.

According to one or more embodiments, at least some or all walls of the glass substrates 20, 40 run along the separation lines between adjacent semiconductor components. Adjacent semiconductor components, which later form the semiconductor devices, are insulated from each other by walls of the respective glass substrate 20, 40.

Figure 2G:
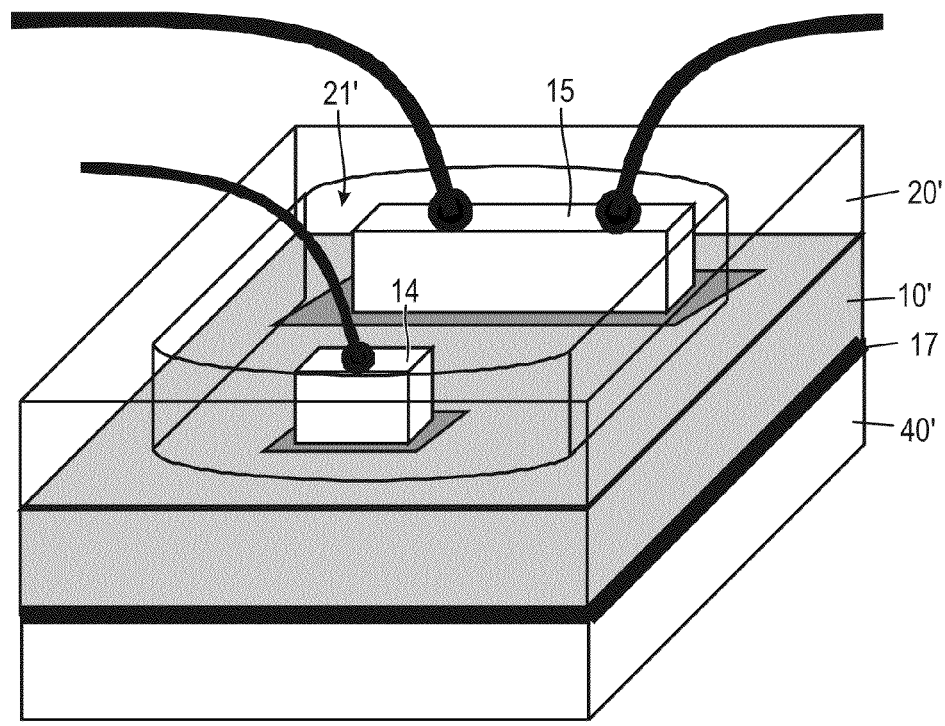
Figure 2H:
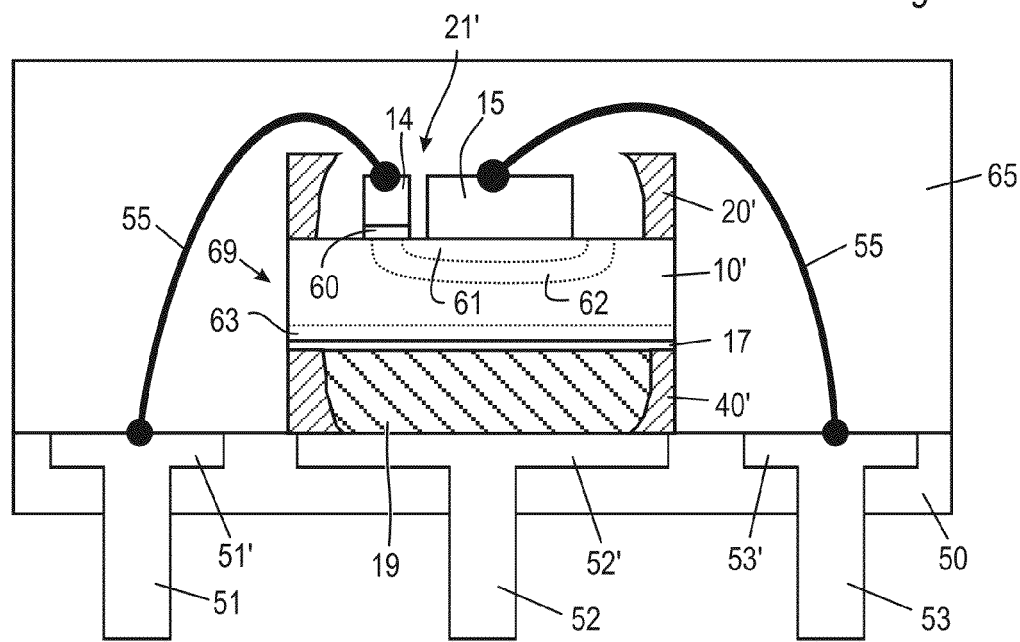

FIG. 2G illustrates a 3-dimensional view of a semiconductor device after dicing. There are also illustrated bond wire connections which will be formed at a later stage. As illustrated, metal pads 14 and 15 are completely laterally surrounded by first glass chip 20' having an exposed cavity or opening 21'. First and second glass chips 20', 40' have together with semiconductor chip 10' a common lateral separation surface 69 at which the metallic seed layer 17 is exposed when present. Hence, the lateral faces 69 of the semiconductor device are mainly formed by the semiconductor material of the semiconductor chip 10' and the glass material of the first and second glass chips 20', 40' but not by the thick metallisation region 19 which is not illustrated here.

FIG. 2H illustrates a final semiconductor device. The semiconductor device is attached to a carrier substrate 50 made of an insulating material. The carrier substrate 50 includes lead structures 51, 52, 53. Lead structures 51 and 53 include bonding pads 51' and 53' arranged on the upper side of the carrier substrate 50 while lead structure 52 includes a large pad 52' to which the semiconductor device is attached with its metallisation region 19 formed on the second surface of the semiconductor chip 10'. Electrical connection between metal pad 14 and bonding pad 51', and metal pad 15 and bonding pad 53', respectively, are provided by bond wires 55.

FIG. 2H also illustrates further structures of the semiconductor device. Metal pad 14 forms in this embodiment a gate electrode which in insulated from the semiconductor material of the chip 10' by a gate dielectric layer 60. Doping regions are also illustrated. 61 denotes a source region while 62 denotes a body region doped opposite to the source region 61 and to the semiconductor material of the chip 10'. A drain region 63 is formed at the second surface of the chip 10'. Drain region 63 is electrically connected to pad 52' through metallisation region 19 while source region 61 is electrically connected to metal pad 15.

Finally, the semiconductor device can be encapsulated in an insulating material 65 such as an epoxy resin to form a semiconductor module.

While FIG. 2H illustrates a three-terminal device such as a FET or an IGBT, FIG. 3 illustrates a two-terminal device such as a power diode according to one or more embodiments.

The semiconductor device includes at least two terminals which are formed in this embodiment by lead structures 56 and 57. These lead structures extend laterally from a carrier substrate 58. The semiconductor device further includes a semiconductor substrate formed in this embodiment by a semiconductor chip 10' having a first surface 11 and a second surface 12. The semiconductor chip 10' having at least one doping region 62 and a metal pad 15. Doping region 62 is formed at the first surface 11 and in electrical contact with metal pad 15 disposed on the first surface 11. Metal pad 15 forms in this embodiment the anode of a power diode. Doping region 62 is oppositely doped to the material of the semiconductor chip 10' which usually have a low n-doping concentration in case of power devices. A further doping region 63 is formed at the second surface 12 and is of the same doping type as the semiconductor material of the chip 10' but has a higher doping concentration.

A first glass substrate or glass chip 20' having at least one opening 21' is bonded to the first surface 11 of the semiconductor substrate 10' such that the metal pad 15 is arranged within the opening 21' of the first glass substrate 20'. A second glass substrate or glass chip 40' having at least one opening 41' is bonded to the second surface 12 of the semiconductor substrate 10'. At least one metallisation region 19 is disposed on the second surface 12 of the semiconductor substrate or semiconductor chip 10'. The metallisation region 19 fills the opening 41' of the second glass substrate 40' and provides an ohmic contact between the doping region 67 and a pad structure 56' of lead structure 56. Metallisation region 19 forms in this embodiment the cathode of the power diode. A metallic seed layer is not illustrated in this embodiment but can be provided if desired.

Metal pad 15 is electrically connected to a pad structure 57' of lead structure 57 by bond wire 55. The semiconductor device is encapsulated in an insulating material 65 such as an epoxy resin.

The semiconductor device has common lateral separation faces 69 formed by the first and second glass substrates 20' and 40' and the semiconductor substrate 10'.

FIG. 4 illustrates an enlarged detail from FIG. 2F indicated there by the dashed-dotted box. Semiconductor wafer 10 includes a thin oxide layer 70 disposed on the first surface 11. The first glass substrate 20 is bonded to that oxide layer 70 by adhesive bonding, which may employ photo-structurable adhesives 71, glass-fit bonding or fusion bonding. In one embodiment, oxide layer 70 can be replaced by a diamond-like-carbon layer. In this case, anodic bonding would also be possible.

Therefore, according to one or more embodiments, an oxide layer 70, or generally an insulating layer 70, is formed on the first surface 11 before bonding the first glass substrate 20.

Second glass substrate 40 is bonded on the thin metallic seed layer 17 by the semiconductor wafer 10 by adhesive bonding using a glass adhesive layer 72. The selected bonding process for the first and the second glass substrate 20, 40 depends on the characteristics of the surface to which the glass substrates are bonded. Since first and second surfaces 11, 12 of the semiconductor wafer 10 can be differently processed, the respective surfaces can exhibit different top layers and therefore different characteristics, so that different bonding processes will be used.

The bonding can include a thermal annealing process. When bonding the second glass substrate 40 to the semiconductor wafer, the annealing temperature should be adjusted to be within the thermal budget of the semiconductor components and also within the tolerable range of the bond connection between the semiconductor wafer 10 and the first glass substrate 20.

With respect to FIGS. 5A to 5D, a further embodiment is described. Structural features, which are similar to structural features described above, are denoted by the same reference numerals. Furthermore, the description of similar processes is omitted and corresponding references included.

Similar to the above described embodiments, a semiconductor wafer 10 having a first surface 11 and a second surface 12 is provided. The semiconductor wafer 10 includes a plurality of semiconductor components 31, 32, 33, 34 each of which includes at least one metal pad 14, 15 disposed on the first surface 11. The present embodiment illustrates two metal pads 14, 15 for each semiconductor component 31, 32, 33, 34. Furthermore, each semiconductor component 31, 32, 33, 34 includes at least one doping region.

Figure 5A:
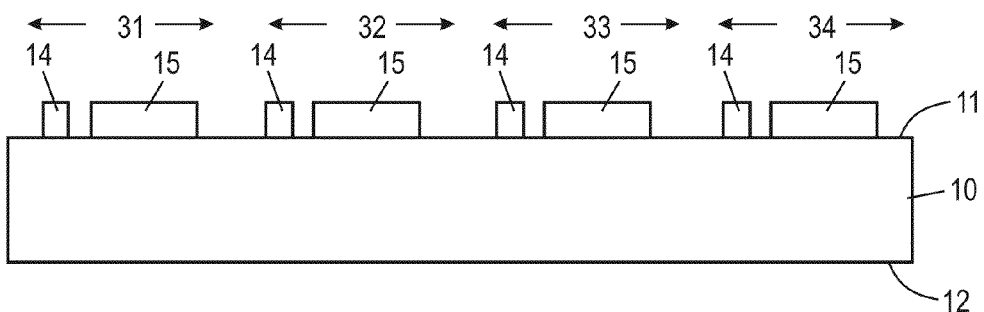
FIGS. 5A to 5D illustrate processes of a method for manufacturing semiconductor devices according to one embodiment.
Figure 5B:
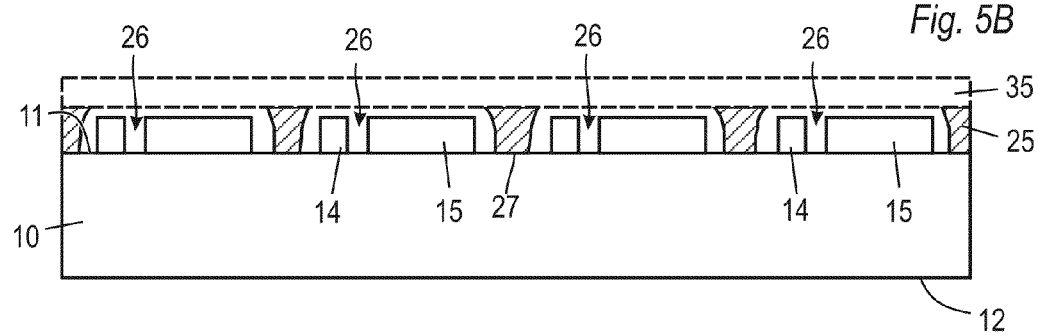

As illustrated in FIG. 5B, a pre-structured first glass substrate 25 having a plurality of openings 26 extending through the first glass substrate 25 is provided. The first glass substrate 25 includes a bonding surface 27. The openings 26 can be formed in advance by suitable processes such as etching. The size of the openings 26 are adapted to allow accommodation of the metal pads 14, 15 as described below.

The first glass substrate 25 is bonded with its bonding surface 27 to the first surface 11 of the semiconductor wafer 10 such that the metal pads 14, 15 of one semiconductor component 31, 32, 33, 34 are arranged within one opening 26 of the first glass substrate 25. For alignment purposes, alignment marks arranged on the semiconductor wafer 10 and the first glass substrate are used. The first glass substrate 25 can be bonded to the semiconductor wafer 10 by any of the above described bonding processes.

The first glass substrate 25 has a thickness which corresponds to the height of the metal pads 14, 15 or is larger than the height of the metal pads. Subsequently, the openings 26 of the first glass substrate 25 can be covered by an optional foil 35 to protect the semiconductor components 31, 32, 33, 34 and the structures arranged on the first surface 11 of the semiconductor wafer 10 during subsequent processes.

In a further process, the semiconductor substrate 10 is thinned as described above to a target thickness $d_2$. The semiconductor substrate 10 has then a processed second surface 12'. As described above, a thin metallic seed layer 17 is formed on the entire machined second surface 12'.

Figure 5C:
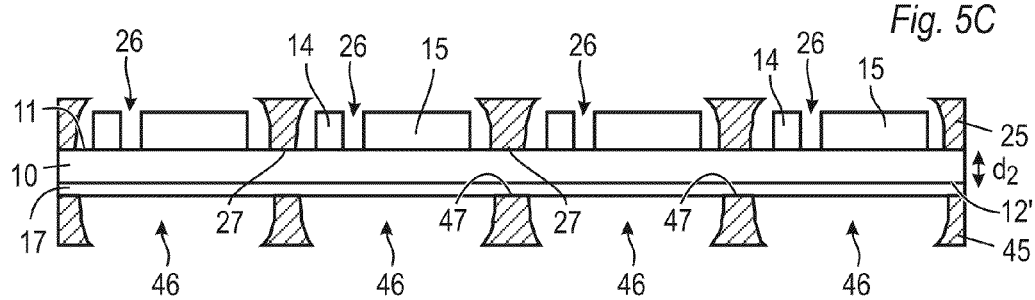
Figure 5D:
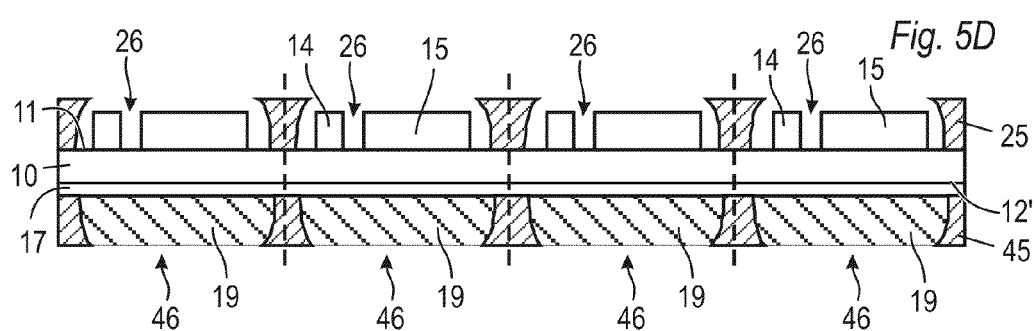

A second glass substrate 45 is provided having a plurality of openings 46 extending through the second glass substrate 45. The second glass substrate 45 has a bonding surface 47 with which the second glass substrate 45 is bonded onto the semiconductor wafer 10, particularly to the metallic seed layer 17, by any of the above described suitable bonding processes. First and second glass substrate 25, 45 are aligned with each other. The foil 35 can be removed at this or at a later stage. The resulting structure is illustrated in FIG. 5C.

In a further process, respective metallisation regions 19 are formed in the openings 46 as described above by any suitable process such as plating, pasting or printing. Subsequently, the semiconductor wafer 10 is diced along the predefined separation lines which are indicated by dashed lines in FIG. 5D. As described above, the separation occurs through the semiconductor wafer 10 and the walls of the respective glass substrates 25, 45 but not through the thick metallisation regions 19.

The embodiment illustrated in FIGS. 5A to 5D differs from the embodiments described above in that the pre-structured glass substrates 25, 45 include openings 26, 46. Processes for thinning the glass substrates 25, 45 are not required, but can be performed if needed.

It is also possible to combine processes from different embodiments. For example, a glass substrate 20 having cavities 21 as described further above can be used as first glass substrate and bonded to the semiconductor wafer 10. As second glass substrate, a glass substrate 45 having openings 46 can be used and bonded to the machined second surface 12' of the semiconductor wafer 10. In this variation, the structures at the first surface 11 of the semiconductor wafer 10 are protected by the first glass substrate 20 when thinning the semiconductor wafer 10 since the cavities 21 are not yet exposed. Furthermore, since the first glass substrate 20 is considerably thick, it stabilises the thinned semiconductor wafer 10 to a larger degree. The first glass substrate 20 can be machined, for example, after forming the metallisation regions 19 on the machined second surface 12' to expose the structures of the semiconductor components, particularly the metal pads.

Figure 6A:
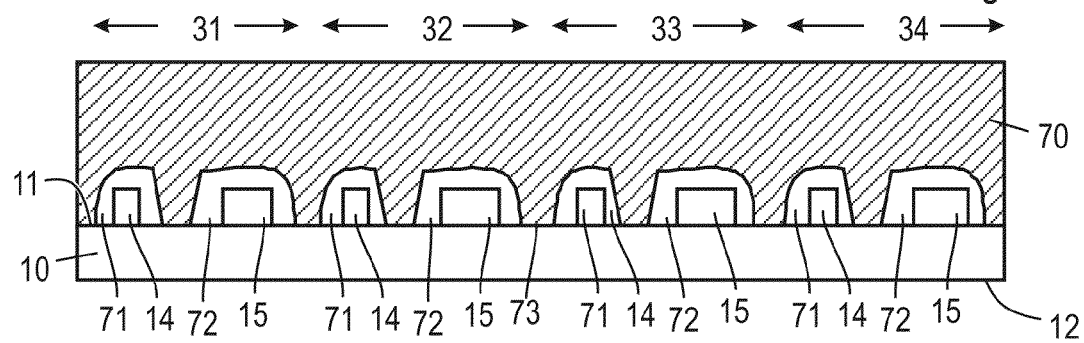
FIGS. 6A to 6C illustrate processes of a method for manufacturing semiconductor devices according to one embodiment.
Figure 6B:
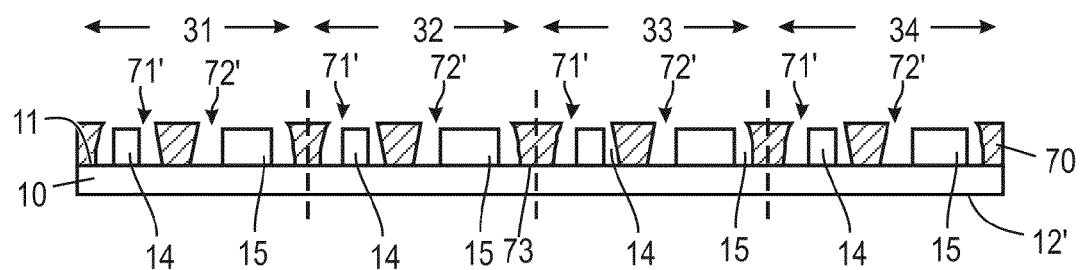
Figure 6C:
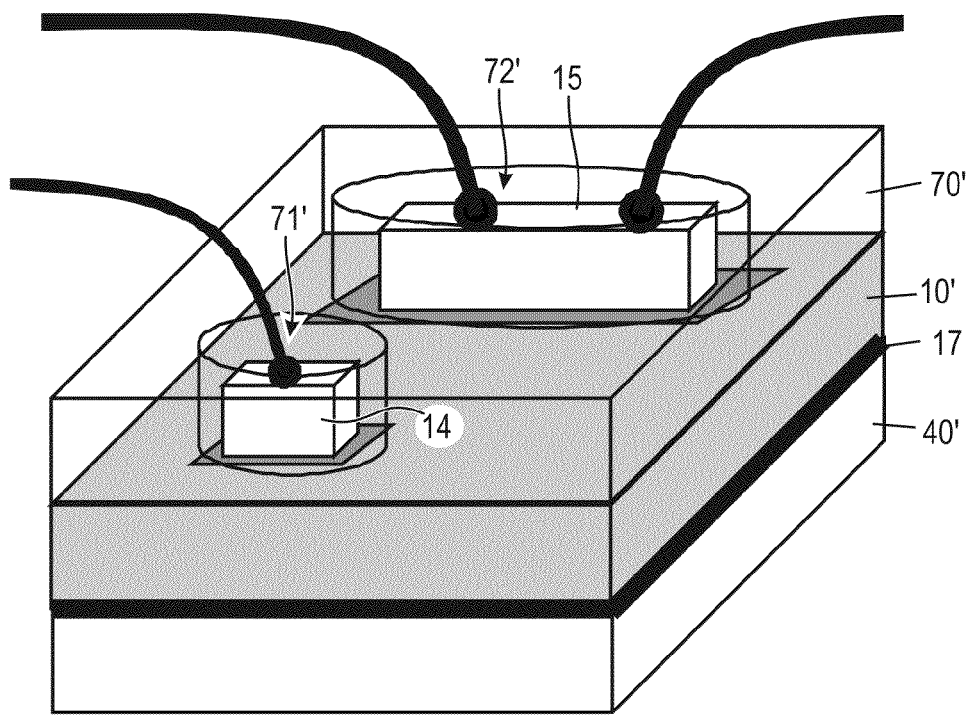

FIG. 6A to 6C illustrates a further embodiment. Structural features, which are similar to structural features described above, are denoted by the same reference numerals. Furthermore, the description of similar processes is omitted and corresponding references included.

A semiconductor wafer 10 having a first surface 11, a second surface 12, and semiconductor components 31, 32, 33, 34 each including at least two metal pads 14, 15 disposed on the first surface 11 is provided. Each of the semiconductor components 31, 32, 33, 34 also includes at least one doping region, typically a plurality of doping regions.

A glass substrate 70 is provided which includes a plurality of cavities 71, 72 formed at a bonding surface 73 of the glass substrate 70. Each cavity 71, 72 is sized to allow accommodation of only one metal pad 14, 15. Metal pads 14, 15 of each semiconductor component 31, 32, 33, 34 can have a different size, particularly a different lateral extent. Therefore, the respective cavities 71, 72 can also be of different size. In this particular embodiment, cavity 71 is sized to allow accommodation of metal pad 14 and cavity 72 is sized to allow accommodation of metal pad 15. In this embodiment cavity 72 is larger than cavity 71.

The glass substrate 70 is aligned and then bonded by using any suitable bonding process as described above. The resulting structure is illustrated in FIG. 6A. Each metal pad 14, 15 is accommodated and encapsulated by a respective cavity 71, 72 so that adjacent metal pads 14, 15 of the same semiconductor component 31, 32, 33, 34 are insulated from each bother by the glass substrate 70 and particularly by the walls of the glass substrate 70 which are disposed between the adjacent metal pads 14, 15.

In further processes, the semiconductor wafer 10 can be thinned. Furthermore, the glass substrate 70 can be machined to expose the cavities 71, 72 and to form openings 71', 72' to allow access to the metal pads 14, 15 of the semiconductor component 31, 32, 33, 34. The adjacent metal pads 14, 15 remain insulated from each other by the walls of the glass substrate 70 as illustrated in FIG. 6B. In a further process, the semiconductor wafer 10 is diced along the separation lines as described above to form semiconductor devices having a semiconductor chip 10' and a glass chip 70'.

A 3-dimensional illustration of such a semiconductor device is illustrated in FIG. 6C. Metal pads 14 and 15, which form for example the gate pad and the source pad of a power FET, respectively, are insulated from each other the glass substrate 70. Other structural elements can be similar to the elements described above. The semiconductor device can particularly include a further glass substrate or glass chip 40' bonded to the second surface of the semiconductor chip 10'.

Figure 7A:
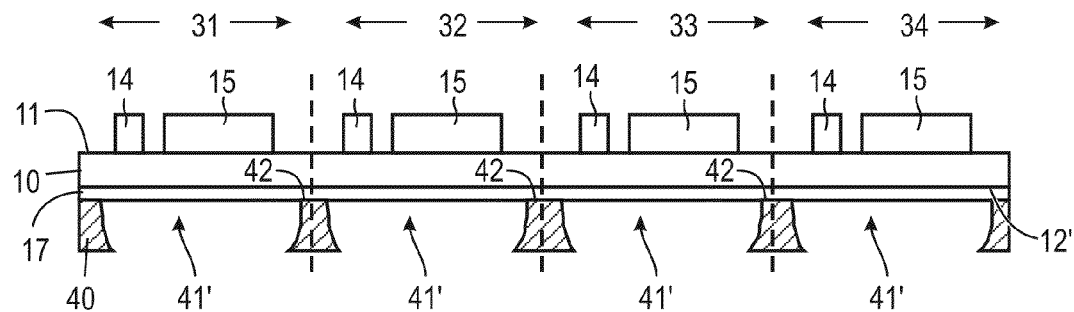
FIGS. 7A to 7B illustrate processes of a method for manufacturing semiconductor devices according to one embodiment.

A further embodiment is described in connection with FIGS. 7A and 7B. Structural features, which are similar to structural features described above, are denoted by the same reference numerals. Furthermore, the description of similar processes is omitted and corresponding references included.

In this embodiment, a semiconductor wafer 10 and a glass substrate 40 bonded to the semiconductor wafer 10 is provided. The glass substrate 40 includes a plurality of openings 41' to expose surface portions of the semiconductor wafer 10. The openings define the size and location of metallisation regions which will be formed later. The glass substrate 40 is bonded with its bonding surface 42 to a second surface 12' of a semiconductor wafer 10. As described above, the bonded glass substrate 40 can include cavities at its bonding surface, which are later exposed by grinding or polishing the bonded glass substrate. In other embodiments, the glass substrate 40 can be bonded with already exposed cavities, i.e. openings. Any suitable bonding process as described above can be used.

Metal pads 14, 15 of a plurality of semiconductor components 31, 32, 33, 34 can be disposed on the first surface 11 of the semiconductor wafer 10. The semiconductor wafer 10 can also include a plurality of doping regions as described above. Furthermore, a metallic seed layer 17 can be formed on the second surface 12' prior to bonding the glass substrate 40.

Figure 7B:
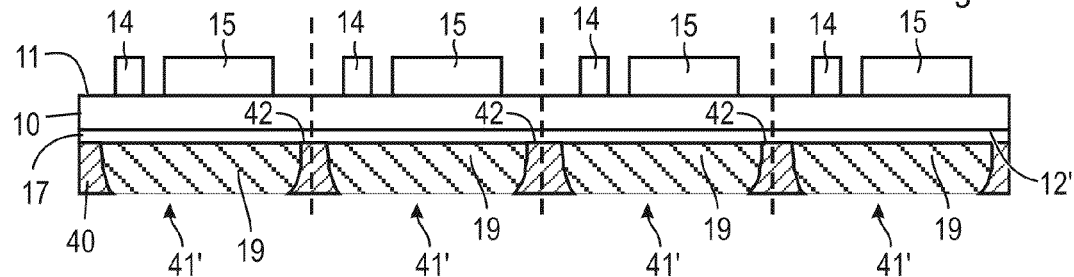

The openings 41' of the glass substrate 40 are filled with a metal or a metal compound to form metallisation regions 19 as illustrated in FIG. 7B. Suitable processes for forming the metallisation regions 19 are, without being limited thereto, plating, printing and pasting. Glass substrate 40 functions as a mask when forming the metallisation regions 19 as described above.

In further processes, the semiconductor wafer 10 is diced along separation lines as described above to obtain separate semiconductor devices.

Figure 8A:
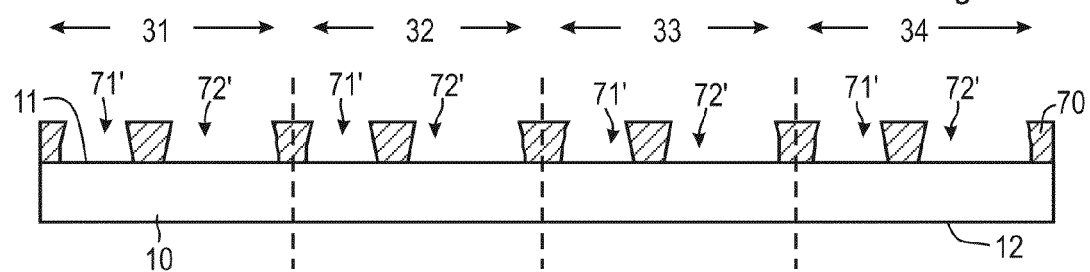
FIGS. 8A to 8B illustrate processes of a method for manufacturing semiconductor devices according to one embodiment.

A further embodiment is described in connection with FIGS. 8A and 8B. Structural features, which are similar to structural features described above, are denoted by the same reference numerals. Furthermore, the description of similar processes is omitted and corresponding references included.

A semiconductor wafer 10, which includes a first surface 11 and a second surface 12, and a glass substrate 70 bonded to the first surface 11 of the semiconductor substrate 10 is provided. The semiconductor wafer 10 includes doping regions to form a plurality of semiconductor components 31, 32, 33, 34. The glass substrate 70 includes a plurality of openings 71', 72' which expose respective portions of the first surface 11 of the semiconductor wafer 10. The openings 71', 72' define the size and location of pad regions which are later formed.

The glass substrate 70 can be bonded to the first surface 11 by any of the above described bonding processes. Typically, a metallic seed layer can be formed on the first surface prior to bonding. When formation of separate pad regions for the same semiconductor component 31, 32, 33, 34 is desired, the metallic seed layer is typically not formed on the entire first surface 11 to avoid a short circuit. Metallic seed layers can be formed within each opening 71', 72' after bonding the glass substrate 70.

The glass substrate 70 can already include the openings 71', 72' when bonded as described above. In one embodiment, the glass substrate 70 can include a plurality of cavities which are exposed by machining the glass substrate after bonding as described above.

Figure 8B:
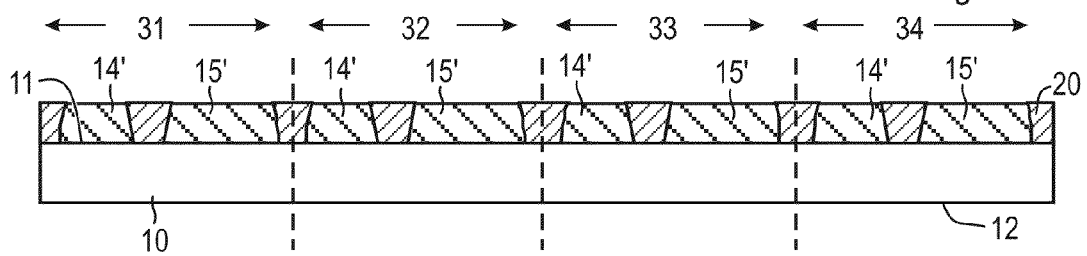

In a further process, the openings 71', 72' are filled with a metal or metal compound such as a metal alloy to provide a plurality of separate metal pad regions 14', 15' as illustrated in FIG. 8B. The metal pad structures 14', 15' can be formed by plating, pasting or printing to obtain thick metal pad structures. Annealing processes may be needed to finish the manufacturing of the metal pad regions 14', 15'. The thick metal pad regions 14', 15' can be used as landing pads for bond wire connections as described above. Due to their thickness, metal pad regions 14', 15' protect the underlying structures from the mechanical stress occurring during bonding. The thickness of the metal pad regions 14', 15' can be defined by the thickness of the glass substrate 70. For example, when a 100 μm thick glass substrate 70 is used, the metal pad regions 14', 15' will have a similar thickness when formed by pasting. It is also possible to form the metal pad regions 14', 15' with other thicknesses.

In further processes, the semiconductor wafer 10 is diced along separation lines as described above to obtain separate semiconductor devices.

The above described embodiments can be combined. For example, the formation of metal pads regions 14', 15' on the first surface 11 of the semiconductor wafer 10 as illustrated in FIGS. 8A and 8B can be combined with the formation of metallisation regions 19 on the second surface 12' of the semiconductor wafer 10 as illustrated in FIGS. 7A and 7B. Furthermore, the semiconductor wafer 10 can be thinned after bonding the glass substrate to the first surface 11 as described above.

Figure 9A:
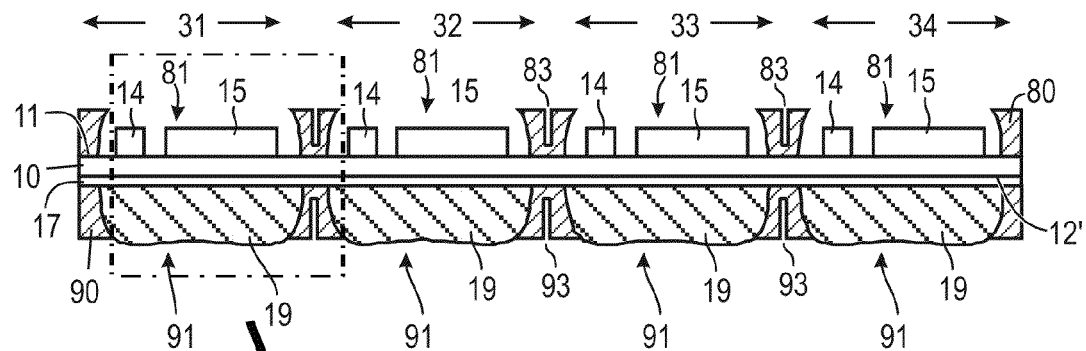
FIGS. 9A to 9C illustrate processes of a method for manufacturing semiconductor devices according to one embodiment.
Figure 9B:
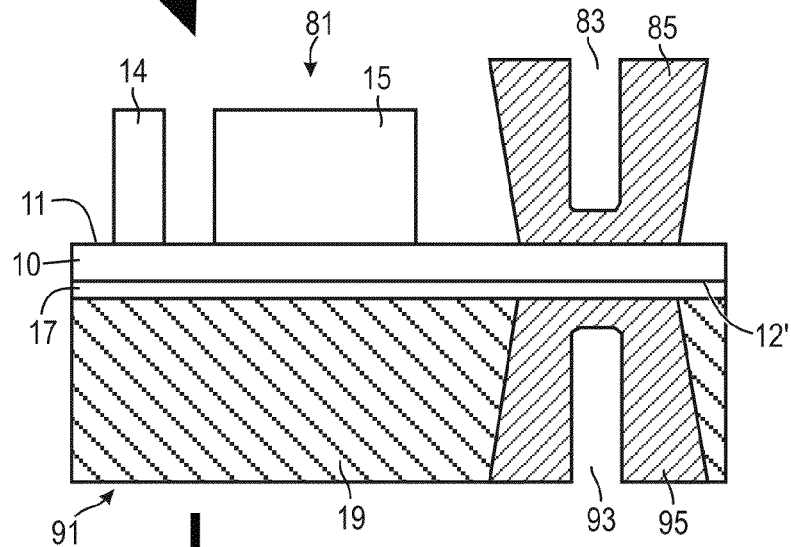
Figure 9C:
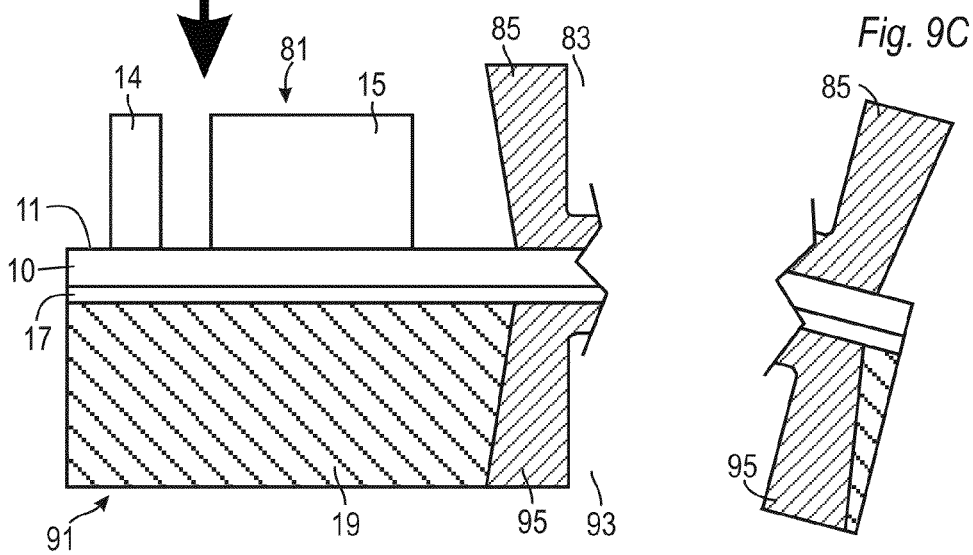

A further embodiment is described in connection with FIGS. 9A to 9C. Structural features, which are similar to structural features described above, are denoted by the same reference numerals. Furthermore, the description of similar processes is omitted and corresponding references included.

This embodiment particularly illustrates options to facilitate separation of the semiconductor components to form separate semiconductor devices. As illustrated in FIG. 9A a semiconductor wafer 10 is provided having a first surface 11 and a second surface 12'. At least one glass substrate is provided, for example on the first surface 11. In one embodiment, a glass substrate is provided on the second surface 12'. It is also possible to provide a first glass substrate 80 on the first surface 11 and a second glass substrate 90 on the second surface 12'.

Trenches 83 are formed in one or both of the first and second glass substrates 80, 90 along pre-defined break lines. FIG. 9A illustrates that trenches 83 are formed in the first glass substrate 80 while trenches 93 are formed in the second glass substrate 90. Trenches 83 and 93 are substantially aligned with each other.

The trenches 83, 93 can be formed prior to bonding the glass substrate 80, 90 or after bonding the glass substrate 80, 90 to the respective surfaces 11, 12. The depth of the trenches 83, 93 can be, for example, equal to at least half of the thickness of the respective glass substrates 80, 90 or even more than that. Forming the trenches 83, 93 after bonding allows formation of deep trenches since otherwise the glass substrates would become mechanically very fragile. The trenches 83, 93 can be formed, for example, by sawing or by any other suitable process.

The semiconductor wafer 10 can include, as described above, a plurality of semiconductor components 31, 32, 33, 34 each of which can include at least one metal pad 14, 15 arranged on the first surface 11. The metal pads 14, 15 of the respective semiconductor components are accommodated within the openings 81 of the first glass substrate 80.

On the second surface 12', metallisation region 19 can be formed as described above.

In a further process, the semiconductor wafer 10 and the glass substrates 80, 90 are separated into dies by breaking along the trenches 83, 93. This is illustrated in FIGS. 9B and 9C which illustrates an enlarged detail from FIG. 9A indicated by dashed-dotted lines. The trenches 83, 93 facilitates breaking since the total material strength of the semiconductor wafer 10 and the first and second glass substrates 80, 90 is significantly reduced along the trenches 83, 93. It should be noted that openings 81 and 91 are laterally surrounded by walls 85, 95 of the respective glass substrates as illustrated in the 3-dimensional illustrations illustrated in FIGS. 2G and 6C. Hence, these openings 81, 91 do not provide breaking lines. Trenches 83, 93 therefore form rated break lines.

The above described separation process can be referred to as "scribe-and-break". Again, separation takes place through material of similar mechanical properties and not through thick metallisation regions formed at the second surface 12'. This avoids difficulties associated with commonly known separation processes which separate semiconductor devices by cutting through brittle semiconductor wafer and thick ductile metal layers. Since the above described embodiments cut mainly through material of similar mechanical properties, the cutting process can be better adapted to the material properties.

The embodiment described in connection with FIGS. 9A to 9C can be combined with any other of the above described embodiments. For example, it is possible to bond glass substrate having cavities and then machining the glass substrates to expose the cavities. Furthermore, metallisation regions can be formed on the second surface and/or on the first surface as described above by using the respective glass substrates as mask. Moreover, the semiconductor wafer can be thinned as described above.

An irreversible carrier system is described above where one or two structured glass substrates are bonded to a semiconductor wafer to support mechanically the semiconductor either on the first or on the second surface or on both surfaces. The glass substrate or substrates remain part of the device even after dicing and can serve as passivation. Furthermore, the structured glass substrate can serve as a mask to form separated and spaced-apart metallisation region so that no cutting through the metallisation regions is needed for dicing. The glass substrates can be structured such that they allow accommodation of metal pads, for example on the first surface. Furthermore, the glass substrates can be structured such that they can be used as mask to form metallisation regions, for example on the first and/or the second surface.

The thickness of the metallisation regions, either on the first surface or on the second surface or on both surfaces can be different and selected according to specific needs. The carrier system described herein allows handling of very thin semiconductor wafers.

A semiconductor wafer supported on a single side by a glass substrate can be thinned to a desired target thickness. Subsequently, a further structured glass substrate can be bonded to the side on which the semiconductor wafer was thinned to obtain a double-side supported semiconductor wafer. The further glass substrate, when structured, can be used to form separate and spaced apart metallisation regions of various thicknesses.

With reference to FIGS. 10A to 10D a further embodiment is described. This embodiment relates to a method for connecting a semiconductor chip to a metal layer of a carrier substrate. The semiconductor chip can be manufactured according to any of the above described embodiments and refers to the situation after dicing.

FIG. 10A shows a semiconductor device 100 including a semiconductor chip 110 and a glass substrate 140. The semiconductor chip 110 has a first side 111 and a second side 112 opposite the first surface 111. At the first side 111, doping regions 130 can be formed. The number and the doping type of the doping regions 130 depend on the specific type of semiconductor device 100. For example, a power diode, being a two-terminal device, typically includes one large anode region at the first side 111. Power FETs, being a three-terminal device, typically include a plurality of substantially identical cells each having a source region and a body region.

It should be noted here that doping regions can also be formed at the second side 112 of the semiconductor chip 110.

The semiconductor chip 110 is bonded with its second side on a bonding surface 142 of a glass substrate 140. The glass substrate 140 includes at least one opening 141. The glass substrate 140 can be formed according to any of the above described embodiments.

For bonding the glass substrate 140 to the semiconductor chip 110, any suitable bonding process can be employed as described above. Examples are anodic bonding with or without a diamond-like-carbon layer (DLC) on the semiconductor chip 110, glass-fit bonding, fusion bonding, and adhesive bonding using a glass adhesive.

The opening 141 of the glass substrate 140 extends through the glass substrate 140 and exposes an area of the second side 112 of the semiconductor chip 110. A metallisation region 119 is arranged in the opening 141 of the glass substrate 140 and electrically contacts the second side 112 of the semiconductor chip 110. Typically, the second side 112 of the semiconductor chip 110 forms the backside of the semiconductor device where the drain region is formed in case of a power FET or the cathode region in case of a power diode. Alternatively, in so-called "source-down" devices, the source is formed at the backside or the electrical connection for the source is formed at the backside.

The metallisation region 119 can be formed as described above, for example by plating, printing or pasting. Typically, a seed layer 117, which also forms a barrier layer, is formed between the metallisation region 119 and the second side 112 of the semiconductor chip 110. The metallisation region 119 can be copper or an alloy including copper as main component. The seed layer 117 is typically made of a material different than the material of the metallisation region 119. For example, the seed layer 117 can be a layer stack, or an alloy, of aluminium, titanium and silver. The seed layer 117 functions also as barrier layer and as adhesion promoter.

Typically, the seed layer 117 is in direct contact with the semiconductor material of the semiconductor chip 100 to provide good ohmic contact to a doping region formed at or extending to the second side of the semiconductor chip 100.

In further embodiments, the metallisation region 119 can also be formed by sputtering or evaporation deposition.

Typically, the metallisation region 119 completely covers the exposed second side 112 of the semiconductor chip 110 within the opening 141 of the glass substrate 140 as shown in FIG. 10A.

As shown in FIG. 10A, the glass substrate 140 has a thickness $d_G$ and the metallisation region 119 has a thickness $d_M$. Both the thickness $d_M$ as well as the thickness $d_G$ can be substantially the same. In an embodiment, $d_M \leq d_G$ which means that the metallisation region 119 does not completely fill the opening 141 as shown in FIG. 10B. This partial filling can be obtained either by partially removing the metallisation region 119 or by partially filling the opening 141 when forming the metallisation region 119. Providing the metallisation region 119 with a thickness $d_M$ which is less than the thickness $d_G$ of the glass substrate 140 can be beneficial particularly for connecting processes which uses a soft solder or an electrically conductive liquid adhesive. This will be explained in connection with FIGS. 10C and 10D.

FIG. 10C shows a carrier substrate 150 which includes a metal layer 151. The carrier substrate 150 can be, for example, a lead frame or a direct copper bonded (DCB) substrate. A given amount of an electrically conductive bonding material 152 is brought onto the metal layer 151 so that a given region of the metal layer 151 is covered by the electrically conductive bonding material 152. As explained above, the electrically conductive bonding material 152 can be a solder or an electrically conductive liquid adhesive.

In case of a solder, the solder 152 can be applied onto the metal layer 151 in the form of a paste. Alternatively, the metal layer 151 is already covered by a solidified solder which was applied in advance onto the metal layer 151. The solder is than typically heated to liquify the solder which forms than, due to the surface tension, a flat drop with a meniscus shape as shown in FIG. 10C.

In case of an electrically conductive liquid adhesive, the adhesive can be applied by any suitable process such as printing. Suitable electrically conductive liquid adhesives are, for example, silver- or copper-particle filled epoxy-glues.

Although FIG. 10C shows that the electrically conductive bonding material 152 is applied onto the metal layer 151 of the carrier substrate 150, the electrically conductive bonding material 152 can also be applied to the metallisation region 119.

In a further process, as illustrated in FIG. 10D, the semiconductor chip 110 with the glass substrate 140 bonded thereto is placed onto the metal layer 151 of the carrier substrate 150 with the electrically conductive bonding material 152 arranged between the metallisation region 119 and the metal layer 115. When the electrically conductive bonding material 152 is a solder, the solder can be heated before contacting the metallisation region 119 with the solder 152. This bringing together is then carried out under elevated temperature sufficient to melt the solder. Alternatively, for example when the solder 152 is applied as a paste, the solder can be heated after contacting the metallisation region 119 and the solder paste.

When the electrically conductive bonding material 152 is an electrically conductive liquid adhesive, this adhesive is still liquid when the metallisation region 119 is brought into contact with the electrically conductive liquid adhesive.

When bringing together the metallisation region 119 and the metal layer 151 with the electrically conductive bonding material 152 arranged therebetween, a pressure can be applied to ensure that the semiconductor chip 110 with its metallisation region 119 is intimately brought into contact with the electrically conductive bonding material 152 and the metal layer 151. As shown in FIG. 10D, a part of the electrically conductive bonding material 152 can be squeezed out of the contact area which is defined by the lateral extend of the glass substrate 140 and the metallisation region 119. This squeezing is also referred to as bleeding-out. The part of the electrically conductive bonding material 152 which is squeezed out of the contact area also partially contact the outer lateral sides of the glass substrate 140. However, the glass substrate 140 provides a non-wettable surface for the electrically conductive bonding material 152 so that the outer lateral side of the glass substrate 140 is typically not wetted by the electrically conductive bonding material 152. As a consequence, the electrically conductive bonding material 152 does not move upwards to the semiconductor chip 110. In addition to that, the glass substrate 140 functions as spacer between the metal layer 151 and the semiconductor chip 110 so that also the electrically conductive bonding material 152 remains spaced apart from the semiconductor chip 110.

It should be noted here that the amount of the electrically conductive bonding material 152 applied onto the metallisation region 119 or the metal layer 151 should be selected such that the electrically conductive bonding material 152 is not applied in large excess. Typically, the amount of the electrically conductive bonding material 152 applied for a given semiconductor chip 110 substantially corresponds to the volume defined by the remaining cavity in the glass substrate 140 as shown in FIG. 10B. In an embodiment, the amount of the electrically conductive bonding material 152 exceeds the volume defined by the remaining cavity in the glass substrate 140 by not more than 30%. The main portion of the electrically conductive bonding material 152 remains in the cavity formed below the metallisation region 119 in the glass substrate 140.

The presence of the glass substrate 140 prevents that the electrically conductive bonding material 152, be it a solder or an electrically conductive liquid adhesive, can reach the lateral rim of the semiconductor chip 110 and can wet the lateral rim of the semiconductor chip 110 above the second side 112. Semiconductor chips 110 without a supporting glass substrate 140 may experience such a wetting. This is described in connection with FIGS. 11A and 11B.

FIG. 11A shows a semiconductor device 200 which includes a semiconductor chip 210 with a first side 211 and a second side 212. Doping regions 230 are formed at the first side 211 as described in connection with the embodiment of FIGS. 10A to 10D. A seed layer 217 is formed on the second side 212 and covered by a metallisation region 219. When such a semiconductor device 200 is brought in contact with a carrier substrate 150 as described above, the liquid electrically conductive bonding material 152, for example a molten solder, can be squeezed out of the contact area between the semiconductor device 200 and the carrier substrate 150 as described above. The "out-squeezed" or "out-bled" electrically conductive bonding material 152 can easily wet the lateral surface of the metallisation region 219 and can creep towards the semiconductor chip 210. As the electrically conductive bonding material 152 also wets the semiconductor chip 210, the electrically conductive bonding material 152 may creep up to the first side 211 of the semiconductor chip 210 which can lead to a short-circuited device. This is shown in the region marked by circle 205.

In addition to short-circuiting, solder components of the solder, which comes into direct contact with the lateral rim of the semiconductor material of the semiconductor chip 210, can also diffuse into the semiconductor material. This can affect the doping characteristics of doping regions of the semiconductor chip 210 or can lead to mechanical breaks. For example, when copper diffuses into silicon, CuSi phases are formed which, due to their volume expansion, cause cracks in the semiconductor material of the semiconductor chip 210.

Although the metallisation region 219 is shown to be comparably thin in FIG. 11A, this risk of wetting the lateral rim of the semiconductor chip 210 is also present for thicker metallisation regions 219 as the electrically conductive bonding material 152 does not experience any creeping barrier. Different thereto, the glass chip 140 provides such a barrier since the glass substrate 140 is not wetted by the electrically conductive bonding material 152. Furthermore, the glass substrate 140 provides a cavity below the metallisation region 119 where the major portion of the electrically conductive bonding material 152 is kept and prevented from bleeding-out. The non-wettable glass substrate 140 ensures that the electrically conductive bonding material 152, which is squeezed out of the contact region, does not come into contact with the lateral surface of the glass substrate 140 and thus cannot creep towards the semiconductor chip 110.

The glass-substrate 140 also reliably prevents a contact between the electrically conductive bonding material 152 and the lateral rim of the semiconductor chip 110 even when the semiconductor chip 110 is laterally moved, for example during bringing together. The glass substrate 140 ensures that there remains enough space between the electrically conductive bonding material 152 and the semiconductor chip 110.

As described above, the bringing together of the semiconductor chip 110 and the carrier substrate 150 with the electrically conductive bonding material 152 arranged therebetween typically includes raising the temperature to melt the solder or to cure the electrically conductive liquid adhesive. After cooling, the solder solidifies. As a result, a firm mechanical and electrical connection between the metal layer 151 and the metallisation region 119 is formed by the solidified electrically conductive bonding material 152.

The final structure is shown in FIG. 10D, which includes the semiconductor chip 110, the glass substrate 140 bonded to the second side 112 of the semiconductor chip 110 and including the at least one opening 141 which exposes an area of the second side 112 of the semiconductor chip 110 in the sense that this area is not covered by the glass substrate 140. The metallisation region 119 is arranged in the opening 141 of the glass substrate 140 and electrically contacts the second side 112 of the semiconductor chip 110 with the glass substrate 140 facing the carrier substrate 150. The metallisation region 119 typically only partially fills the opening 141. The remaining portion of the opening 141 is filled by the electrically conductive bonding material 152. The glass substrate 140 has a thickness $d_G$ and the metallisation region 119 has a thickness $d_M$, wherein $d_G \geq d_M$. A firm mechanical and electrical connection is formed by the electrically conductive bonding material 152 between the metal layer 151 of the carrier substrate 150 and the metallisation region 119. The electrically conductive bonding material 152 can also be in contact with the lower side of the glass substrate 140 and partially with lateral side faces of the glass substrate 140 as shown in FIG. 10D.

With reference to FIGS. 12A to 12D, a further embodiment is described. Similar as for the embodiment of FIGS. 10A to 10D, a semiconductor device 101 includes a semiconductor chip 110 having a first and a second side 111, 112 with doping regions 130 formed at the first side 111. The semiconductor chip 110 is bonded with its second side onto a bonding surface 142 of a glass substrate 140 which includes at least one opening 141. The opening 141 leaves an area of the second side 112 of the semiconductor chip 110 uncovered, i.e. this area is exposed. The opening 141 is filled with a metallisation region 119 covered with a layer of reactive metal 120. Between the metallisation region 119 and the second side 112 of the semiconductor chip 110, a seed or barrier layer 117 can be formed. The metallisation region 119 can include copper or an alloy comprising copper as main component. The reactive metal layer 120 can include tin or an alloy comprising tin as main component.

The glass substrate 140 has a thickness $d_G$ and the metallisation region 119 and the reactive metal layer 120 together have a thickness $d_M$. In this embodiment the thicknesses $d_G$ and $d_M$ obey the following relation $d_G \leq d_M$, i.e. the thickness of the metallisation region 119 together with the reactive metal layer 120 is at least as large as the thickness of the glass substrate 140. According to an embodiment, $d_G < d_M$.

The semiconductor device 101 is brought in contact with a carrier substrate 250 which includes a metal layer 251. The metal layer 251 can be made of copper or a copper alloy including copper as main component. When bringing together the semiconductor device 101 and the carrier substrate 250, the reactive metal layer 120 comes into contact with the metal layer 251 of the carrier substrate 250. Upon applying pressure and heat to bring the reactive metal layer 120, the metal layer 251, and the metallisation region 119 to a sufficiently high temperature, the reactive metal layer 120, the metal layer 251, and the metallisation region 119 are subjected to diffusive soldering which brings about a typical eutectic intermetallic phase (IMP) 121. In case of copper as main component of the metal layer 251 and the metallisation region 119, and tin as main component of the reactive metal layer 120, the intermetallic phase 121 is CuSn.

FIG. 12C illustrates the case where the diffusion of Sn into the metal layer 251 takes place only within the opening 141 of the glass substrate 140. In this case, the intermetallic phase 121 is confined by the glass substrate 140.

FIG. 12D illustrates the case where Sn also diffuses to regions of the metal layer 251 which are laterally adjacent to the opening 141. Due to the diffusion of Sn, the melting temperature in these regions drops (eutectic) and these regions melt. Hence, a similar soldering profile as in the case of the soft solder of FIGS. 10A to 10D is observed. However, even in this case, the glass substrate 140 reliably prevents contact between the molten regions of the intermetallic phase 121 and the semiconductor chip 110.

Also in the case of the diffusion soldering, the thickness $d_G$ of glass substrate 140 is larger than the thickness of the metallisation region 119 in the final structure.

FIGS. 13A and 13B illustrating the case where diffusion bonding is carried out without a glass substrate bonded to a semiconductor chip 210 of a semiconductor device 201. The semiconductor chip 210 also has a first side 211 and a second side 212 at which doping regions 230 are formed. A seed layer 217, a metallisation region 219 and a reactive metal layer 220 are formed in this order on the second side 212 of the semiconductor chip 210.

When bringing the semiconductor chip 210 with its reactive metal layer 220 into contact with a metal layer 251 of a carrier substrate 250 under pressure and at elevated temperature, diffusion bonding takes place which leads to the intermetallic phase 221 as shown in FIG. 13B. Since no non-wettable glass substrate is present, the molten regions of the intermetallic phase 221 may come into contact with the lateral rim of the semiconductor chip 210 as described above and as indicated at 206.

The above problems can be provided by using a glass substrate 140 as a carrier material for the semiconductor chip 110. The glass substrate 140 remains bonded on the second side of the semiconductor chip 110.

Therefore, a method is provided which includes providing a semiconductor chip 110 having a first side 111, a second side 112 opposite the first side 111, a glass substrate 140 bonded to the second side 112 of the semiconductor chip 110 and including at least one opening 141 exposing an area of the second side 112 of the semiconductor chip 110, and a metallisation region 119 arranged in the opening 141 of the glass substrate 140 and electrically contacting the second side 112 of the semiconductor chip 110. The metallisation region 119 typically completely covers the second side 112 which is exposed in the opening 141.

In a further process, the semiconductor chip 110 is brought with the bonded glass substrate 140 onto a metal layer 151 of a carrier substrate 150. A firm mechanical and electrical connection between the metal layer 151 of the carrier substrate 150 and the metallisation region 119 is formed.

This results in a semiconductor device which includes the semiconductor chip 110, the glass substrate 140 bonded to the second side 112 of the semiconductor chip 110 and including at least one opening 141 leaving an area of the second side 112 of the semiconductor chip 110 uncovered by the glass substrate 140. The metallisation region 119 is arranged in the opening 141 of the glass substrate 140 and electrically contacts the second side 112 of the semiconductor chip 110. A firm mechanical and electrical connection 121, 152 is formed between the metal layer 151 of the carrier substrate 150 and the metallisation region 119. The firm mechanical and electrical connection 121, 152 between the metal layer 151 of the carrier substrate 150 and the metallisation region 119 can be formed by one of a solder, an electrically conductive adhesive, and an eutectic intermetallic phase. Furthermore, the firm mechanical and electrical connection 121, 152 between the metal layer 151 of the carrier substrate 150 and the metallisation region 119 is mainly formed within the opening 141 of the glass substrate 140.

In the following, further embodiments are generally described.

According to an embodiment, a method for manufacturing semiconductor devices includes providing a semiconductor wafer having a first surface and a second surface opposite to the first surface, the semiconductor wafer including a plurality of doping regions and metal pads, which are arranged on or at the first surface; providing a first glass substrate having a bonding surface and at least one of cavities and openings at the bonding surface; bonding the first glass substrate with its bonding surface to the first surface of the semiconductor wafer such that one or more metal pads are arranged within respective cavities or openings of the first glass substrate; machining the second surface of the semiconductor wafer; forming at least one metallisation region on the machined second surface of the semiconductor wafer; and dicing the semiconductor wafer and the first glass substrate to obtain separate semiconductor devices.

According to an embodiment, the method further includes bonding the first glass substrate to the first surface of the semiconductor wafer by at least one of anodic bonding, adhesive bonding, fusion bonding and glass-fit bonding.

According to an embodiment, the method further includes machining the first glass substrate to expose the cavities.

According to an embodiment, the method further includes forming a metallic seed layer on the second surface of the semiconductor wafer before forming the metallisation region.

According to an embodiment, the method further includes providing a second glass substrate having openings; bonding the second glass substrate to the second surface of the semiconductor wafer; and filling the openings of the second glass substrate with a metal or a metal compound to form respective metallisation regions.

According to an embodiment, the method further includes providing a second glass substrate having a bonding surface and cavities at the bonding surface; bonding the second glass substrate with its bonding surface to the second surface of the semiconductor wafer; machining the second glass substrate to expose the cavities; and filling the exposed cavities of the second glass substrate with a metal or a metal compound to form respective metallisation regions.

According to an embodiment, the metallisation is formed by at least one of plating, pasting and printing.

According to an embodiment, the method further includes providing trenches in the first glass substrate along pre-defined break lines; and dicing the semiconductor wafer and the first glass substrate by breaking along the trenches.

According to an embodiment, the method further includes providing trenches in the second glass substrate along pre-defined break lines; and dicing the semiconductor wafer, the first glass substrate and the second glass substrate by breaking along the trenches.

According to an embodiment, the method further includes fixing the separate semiconductor devices on respective carrier substrates having at least one bonding pad; forming respective wire bonds between the metal pads and respective bonding pad or bonding pads of the carrier substrates; and encapsulating the semiconductor devices fixed to respective carrier substrates in an insulating material.

According to an embodiment, a method for manufacturing semiconductor devices includes: providing a semiconductor wafer having a first surface and a second surface opposite to the first surface, the semiconductor wafer including a plurality of doping regions and metal pads, which are arranged on or at the first surface; providing a first glass substrate having a bonding surface and cavities formed at the bonding surface; bonding the first glass substrate with its bonding surface to the first surface of the semiconductor wafer such that the metal pads are arranged within respective cavities of the first glass substrate; providing a second glass substrate having a bonding surface and cavities formed at the bonding surface; bonding the second glass substrate with its bonding surface to the second surface of the semiconductor wafer; machining the second glass substrate to expose the cavities; forming metallisation regions within the exposed cavities of the second glass substrate by at least one of plating, pasting and printing; and dicing the semiconductor wafer, the first glass substrate and the second glass substrate to obtain separate semiconductor devices.

According to an embodiment, the method further includes machining the second surface of the semiconductor wafer to reduce the thickness of the semiconductor wafer before bonding the second glass substrate.

According to an embodiment, the method further includes machining the first glass substrate to expose the cavities after bonding the second glass substrate.

According to an embodiment, a method for manufacturing semiconductor devices include: providing a semiconductor wafer and a glass substrate bonded to the semiconductor wafer, wherein the glass substrate has a plurality of openings to expose surface portions of the semiconductor wafer, the openings defining metallisation regions; filling the openings of the glass substrate with a metal or a metal compound to form metallisation regions; and dicing the semiconductor wafer and the glass substrate to obtain separate semiconductor devices.

According to an embodiment, the semiconductor substrate includes a first surface, a second surface, a plurality of doping regions and metal pads, wherein the metal pads are arranged on the first surface, and wherein the glass substrate is bonded to the second surface of the semiconductor wafer.

According to an embodiment, the glass substrate includes a bonding surface and a plurality of cavities formed at the bonding surface, and wherein the glass substrate is bonded to the semiconductor wafer with its bonding surface. The method further includes: machining the glass substrate to expose the cavities to form the openings in the glass substrate; and filling the openings in the glass substrate with a metal or a metal compound to form the metallisation regions.

According to an embodiment, the method further includes providing trenches in the glass substrate along pre-defined break lines; and dicing the semiconductor wafer and the glass substrate by breaking along the trenches.

According to an embodiment, a method for manufacturing semiconductor devices includes: providing a semiconductor wafer; providing a glass substrate; forming trenches in the glass substrate along pre-defined break lines; bonding the glass substrate to the semiconductor wafer; and dicing the semiconductor wafer and glass substrate by breaking along the trenches.

According to an embodiment, the trenches are formed after the glass substrate is bonded to the semiconductor wafer.

According to an embodiment, the glass substrate includes openings exposing portions of the semiconductor wafer, wherein metallisation regions are formed in the openings.

According to an embodiment, the glass substrate includes cavities which face the semiconductor wafer. The method further includes: machining the glass substrate to expose the cavities to form the openings in the glass substrate; and filling the thus formed openings in the glass substrate with a metal or a metal compound to form metallisation regions.

According to an embodiment, a semiconductor device includes: at least two terminals; a semiconductor substrate having a first surface and a second surface, the semiconductor substrate includes at least one doping region and a metal pad, which is arranged on the first surface; a first glass substrate having at least one opening, the first glass substrate is bonded to the first surface of the semiconductor substrate such that the metal pad is arranged in the opening of the first glass substrate; a second glass substrate having at least one opening, the second glass substrate is bonded to the second surface of the semiconductor substrate; at least one metallisation region on the second surface of the semiconductor substrate, the metallisation region filling the opening of the second glass substrate.

According to an embodiment, the first glass substrate, the second glass substrate and the semiconductor substrate forming a common lateral surface.

According to an embodiment, the semiconductor device further includes a carrier substrate having at least one bonding pad and a bond wire connection which electrically connects the metal pad on the first surface of the semiconductor substrate with the bonding pad of the carrier substrate.

It is to be understood that the features of the various example embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for connecting a semiconductor chip to a metal layer of a carrier substrate, comprising:

providing a semiconductor chip comprising a first side, a second side opposite the first side, a glass substrate bonded to the second side of the semiconductor chip and comprising at least one opening leaving an area of the second side of the semiconductor chip uncovered by the glass substrate, and a metallisation region arranged in the opening of the glass substrate and electrically contacting the second side of the semiconductor chip;

providing a carrier substrate comprising a metal layer;

bringing an electrically conductive bonding material on at least one of the metal layer of the carrier substrate and the metallisation region in the opening of the glass substrate;

placing the semiconductor chip with the bonded glass substrate onto the metal layer of the carrier substrate with the electrically conductive bonding material arranged between the metallisation region and the metal layer; and forming a firm mechanical and electrical connection between the metal layer and the metallisation region through the electrically conductive bonding material.

2. A method of claim 1, wherein the glass substrate has a given thickness which is larger than a thickness of the metallisation region so that the opening in the glass substrate is not completely filled with the metallisation region.

3. A method of claim 1, wherein the metallisation region comprises copper or an alloy comprising copper as main component.

4. A method of claim 1, wherein a seed layer made of a material different than a material of the metallisation region is formed between the metallisation region and the second side of the semiconductor chip.

5. A method of claim 1, wherein the electrically conductive bonding material is a solder, wherein the method further includes:
bringing the solder on a region of the metal layer;
heating the solder until the solder melts to cover a region of the metal layer; and
cooling the molten solder to provide the firm mechanical and electrical connection between the metal layer and the metallisation region.

6. A method of claim 1, wherein the electrically conductive bonding material is an electrically conductive liquid adhesive, wherein the method further includes:
bringing the electrically conductive adhesive on a region of the metal layer; and
curing the electrically conductive adhesive to provide the firm mechanical and electrical connection between the metal layer and the metallisation region.

7. A method of claim 6, wherein curing of the electrically conductive adhesive comprises heating the electrically conductive adhesive.

8. A method of claim 1, wherein the glass substrate has a thickness $d_G$ and the metallisation region has a thickness $d_M$, wherein $d_M \leq d_G$.

9. A method of claim 1, wherein providing the semiconductor chip comprises:
providing a semiconductor wafer comprising a plurality of semiconductor regions each defining a semiconductor chip, the semiconductor wafer comprising a first side and a second side opposite the first side, and a glass wafer comprising a bonding surface and a plurality of openings, wherein the glass wafer is bonded with its bonding surface to the second side of the semiconductor wafer so that a respective one of the openings in the glass wafer is aligned with a respective one of the semiconductor regions of the semiconductor wafer to expose respective areas of the second side of the semiconductor wafer;
at least partially filling the openings in the glass substrate with a metal to form respective metallisation regions; and
dicing the semiconductor wafer and the glass wafer to obtain separate semiconductor chips.

10. A method of claim 9, further comprises:
forming a seed layer made of a different material than the metallisation regions on the second side of the semiconductor wafer before filling the openings of the glass wafer with the metal.

11. A method of claim 9, wherein filling of the opening comprises:
filling the opening with the metal by at least one of plating, printing, and pasting.

12. A method for soldering a semiconductor chip, comprising:
providing a semiconductor chip comprising a first side, a second side opposite the first side, a glass substrate bonded to the second side of the semiconductor chip and comprising at least one opening leaving an area of the second side of the semiconductor chip uncovered by the glass substrate, and a metallisation region arranged in the opening of the glass substrate and electrically contacting the second side of the semiconductor chip, the metallisation region being covered by a reactive metal layer;
pressing the semiconductor chip with the bonded glass substrate onto a region of a metal layer of a carrier substrate so that the reactive metal layer comes into contact with the metal layer; and
heating the semiconductor chip pressed on the metal layer.

13. A method of claim 12, wherein the glass substrate has a thickness $d_G$ and the metallisation region and the reactive metal layer together have a thickness $d_M$, wherein $d_G \leq d_M$.

14. A method of claim 12, wherein the metallisation region comprises copper or an alloy comprising copper as main component.

15. A method of claim 12, wherein the reactive metal layer comprises tin or an alloy comprising tin as main component.

16. A method of claim 12, wherein a seed layer made of a material different than a material of the metallisation region is formed between the metallisation region and the second side of the semiconductor chip.

17. A method for connecting a semiconductor chip to a metal layer of a carrier substrate, comprising:
providing a semiconductor chip comprising a first side, a second side opposite the first side, a glass substrate bonded to the second side of the semiconductor chip and comprising at least one opening leaving an area of the second side of the semiconductor chip uncovered by the glass substrate, and a metallisation region arranged in the opening of the glass substrate and electrically contacting the second side of the semiconductor chip;
bringing the semiconductor chip with the bonded glass substrate onto a metal layer of a carrier substrate; and
forming a firm mechanical and electrical connection between the metal layer of the carrier substrate and the metallisation region.

18. A method of claim 17, wherein forming the firm mechanical and electrical connection comprises soldering the metallisation region to the metal layer of the carrier substrate.

19. A method of claim 17, wherein the carrier substrate is one of a lead frame and a direct copper bonded substrate.

20. A semiconductor device, comprising:
a semiconductor chip comprising a first side and a second side opposite the first side;
a glass substrate bonded to the second side of the semiconductor chip and comprising at least one opening leaving an area of the second side of the semiconductor chip uncovered by the glass substrate;
a metallisation region arranged in the opening of the glass substrate and electrically contacting the second side of the semiconductor chip;
a carrier substrate comprising a metal layer; and
a firm mechanical and electrical connection between the metal layer of the carrier substrate and the metallisation region.

21. A semiconductor device of claim 20, wherein the carrier substrate is one of a lead frame and a direct copper bonded substrate.

22. A semiconductor device of claim 20, wherein the firm mechanical and electrical connection between the metal layer of the carrier substrate and the metallisation region is formed by one of a solder, an electrically conductive adhesive, and an eutectic intermetallic phase.

23. A semiconductor device of claim 20, wherein the glass substrate has a thickness $d_G$ and the metallisation region has a thickness $d_M$, wherein $d_G \geq d_M$.

* * * * *